(12) United States Patent
Ishii

(10) Patent No.: US 7,554,120 B2
(45) Date of Patent: Jun. 30, 2009

(54) CIRCUIT BOARD FOR ELECTRO-OPTICAL DEVICE, ELECTRO-OPTICAL DEVICE, AND ELECTRONIC APPARATUS

(75) Inventor: Tatsuya Ishii, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 40 days.

(21) Appl. No.: 11/779,579

(22) Filed: Jul. 18, 2007

(65) Prior Publication Data
US 2008/0048190 A1 Feb. 28, 2008

(30) Foreign Application Priority Data
Aug. 24, 2006 (JP) .............................. 2006-227413
Nov. 13, 2006 (JP) .............................. 2006-306742

(51) Int. Cl.
*H01L 29/786* (2006.01)
(52) U.S. Cl. .............................. 257/72; 349/44; 349/46
(58) Field of Classification Search ................... 257/72; 349/44, 46
See application file for complete search history.

(56) References Cited

U.S. PATENT DOCUMENTS

| | | | |
|---|---|---|---|
| 6,493,046 B1 * | 12/2002 | Ueda ............................. | 349/38 |
| 7,075,594 B2 * | 7/2006 | Ueda et al. ..................... | 349/44 |
| 7,123,323 B2 * | 10/2006 | Honbo et al. ................. | 349/111 |
| 2002/0057403 A1 | 5/2002 | Yasukawa et al. | |
| 2002/0071073 A1 | 6/2002 | Sekine et al. | |
| 2002/0089617 A1 * | 7/2002 | Fukata et al. ................. | 349/44 |
| 2004/0008295 A1 | 1/2004 | Ueda et al. | |
| 2004/0141130 A1 * | 7/2004 | Kawata et al. .............. | 349/139 |
| 2006/0243977 A1 | 11/2006 | Yamasaki | |

FOREIGN PATENT DOCUMENTS

| | | |
|---|---|---|
| EP | 1 365 277 A2 | 11/2003 |
| JP | A-2001-356371 | 12/2001 |
| JP | A 2002-132186 | 5/2002 |
| JP | A-2002-158360 | 5/2002 |
| JP | A 2003-262888 | 9/2003 |
| JP | A 2004-4722 | 1/2004 |
| JP | A 2005-222019 | 8/2005 |
| JP | B2 3731447 | 10/2005 |

* cited by examiner

*Primary Examiner*—Kiesha L Rose
*Assistant Examiner*—Mark W Tornow
(74) *Attorney, Agent, or Firm*—Oliff & Berridge, PLC

(57) ABSTRACT

A circuit board includes: a plurality of data lines and a plurality of scanning lines; a transistor that has a semiconductor layer and a gate electrode. The semiconductor layer includes a first junction region that is formed between the channel region and the data-line-side source/drain region, and a second junction region that is formed between the channel region and the pixel-electrode-side source/drain region, wherein the first insulator film has an elongated groove, which extends along at least one of the first junction region and the second junction region over the substrate in plan view, and the gate electrode has an inner groove portion that is provided in an extending manner from a portion thereof overlapping the channel region to at least a part inside the groove.

12 Claims, 12 Drawing Sheets

CIRCUIT BOARD FOR ELECTRO-OPTICAL DEVICE, ELECTRO-OPTICAL DEVICE, AND ELECTRONIC APPARATUS

BACKGROUND

1. Technical Field

The present invention relates to a technical field of a circuit board used for an electro-optical device such as a liquid crystal device, an electro-optical device having such a circuit board, and an electronic apparatus such as a liquid crystal projector that is provided with such an electro-optical device.

2. Related Art

A Liquid crystal device, which is an example of an electro-optical device, is widely used not only as a direct-view-type display device but also, for example, optical modulation means, such as a light valve, of a projection-type display device. When a liquid crystal device is employed in a projection-type display device, an intense light coming from a light source enters into a liquid crystal light-valve. In order to prevent such an intense light from causing an increase in a leakage current at a thin film transistor (TFT) provided in the liquid crystal light valve and/or any malfunction of the TFT, the liquid crystal light valve has a built-in light-shielding film which functions as light-shutting means for shutting any incident light off. Regarding such light-shielding means or a light-shielding film, as an example of published documents, JP-A-2004-4722 discloses a technique for shutting light off by means of scanning lines each of which functions as a gate electrode in the channel region of a TFT. Japanese Patent No. 3,731,447 discloses a technique in which an amount of light that reaches the channel region of a TFT is reduced by means of a plurality of light-shielding films deposited on the channel region and a light absorption layer that absorbs an inner reflected light JP-A-2003-262888 discloses a technique that makes it possible to ensure the appropriate operation of TFTs and to narrow scanning lines, and further to reduce the amount of an incident light beam that enters the channel region of a TFT as small as possible.

When such a light-shielding film as one described above is used to shut light off to protect a TFT, however, the light-shielding film is deposited not in direct contact with a semiconductor layer that constitutes a part of a TFT but separately therefrom in such a manner that some other layer, for example, an insulator film, is interposed therebetween when viewed in three dimensions. According to such a configuration, there is a risk that an incident light beam entering inside at an oblique angle to bypass the light-shielding film reaches the semiconductor layer that constitutes a part of the TFT thereby causing the generation of a light leakage current in the TFT. Due to the generation of light leakage currents in TFTs as described above, there could occur a technical problem of the generation of a flicker noise, nonuniformity among pixels, and so on, which results in degradation in the quality of a displayed image.

SUMMARY

An advantage of some aspects of the invention is to provide a circuit board used for an electro-optical device such as a liquid crystal device that is driven in an active matrix format. The electro-optical device to which the invention is directed is capable of reducing the generation of any light leakage current in a TFT that is provided for pixel switching, thereby providing an image display having an excellent quality. The invention further provides an electro-optical device having such a circuit boards, and an electronic apparatus that is provided with such an electro-optical device.

In order to address the above problem among others, a circuit board for an electro-optical device according to an aspect of the invention includes: a data line and a scanning line that intersect each other in a display area; a pixel electrode; a gate electrode layer; a transistor; and a first insulator. The transistor includes: a semiconductor layer and a gate electrode. The semiconductor layer includes a channel region, a data-line-side source/drain region that is electrically connected to the data line, a pixel-electrode-side source/drain region that is electrically connected to the pixel electrode, a first junction region that is formed between the channel region and the data-line-side source/drain region, and a second junction region that is formed between the channel region and the pixel-electrode-side source/drain region. The gate electrode is a portion of the gate electrode layer located above and overlapping the semiconductor layer. The first insulator film is interposed between the gate electrode and the semiconductor layer. The first insulator film is formed with an elongated groove, the groove being elongated in a first direction corresponding to a direction from at least one of the first junction region and the second junction region to the channel region in plan view. An inner groove portion of the gate electrode layer other than the gate electrode extending at least partially inside the groove.

According to an electro-optical device circuit board of this aspect of the invention, an image signal supplied through a data line to a pixel electrode is controlled, thereby making it possible to perform image display according to a so-called active matrix scheme. Note that the image signal is supplied from the data line to the pixel electrode via a transistor at a predetermined timing by turning the transistor ON/OFF, where the transistor serves as a switching element that is electrically connected between the data line and the pixel electrode. The pixel electrode is a transparent electrode that is made of a transparent conductive material such as ITO (Indium Tin Oxide). A plurality of pixel electrodes is provided in a matrix arrangement pattern in a region that functions as a display area over the substrate in such a manner that each of the pixel electrodes corresponds to an intersection of the data line and the scanning line.

The transistor has a semiconductor layer that includes a channel region, a data-line-side source/drain region, and a pixel-electrode-side source/drain region. In addition, the transistor has a gate electrode that overlaps the channel region.

The channel region has a channel length along one direction in a display area. The term "first direction" according to this invention means either a row direction of a plurality of pixels arranged in a matrix pattern over a substrate, that is, an arrangement direction in which a plurality of data lines is arranged sequentially or a direction in which each of a plurality of scanning lines extends (i e. the X direction), or a column direction of the plurality of pixels arranged in the matrix pattern over the substrate, that is, an arrangement direction in which the plurality of scanning lines is arranged sequentially or a direction in which each of the plurality of data lines extends (i.e. the Y direction).

The data-line-side source/drain region and the data line are electrically connected to each other. The pixel-electrode-side source/drain region and the pixel electrode are electrically connected to each other. In addition, a first junction region is formed between the channel region and the data-line-side source/drain region of the semiconductor layer, whereas a second junction region is formed between the channel region and the pixel-electrode-side source/drain region of the semiconductor layer. The first junction region is a region that is formed at a junction portion between the channel region and the data-line side source/drain region, and the second junction region is a region that is formed at a junction portion between the channel region and the pixel-electrode side source/drain region. That is, the first junction region and the second junction region mean, for example, PN junction regions when the transistor is configured as an NPN (negative-positive-negative) transistor or a PNP (positive-negative-positive)transistor (i.e. as an N-channel transistor or as a P-channel transistor), or LDD regions when the transistor has an LDD structure, which are impurity regions that are formed by implanting impurities into a semiconductor layer by using, for example, an ion implantation method, and so on.

The gate electrode is deposited at the upper-layer side over the semiconductor layer with a first insulator film being interposed therebetween. The first insulator film functions as a gate insulator film that insulates the gate electrode from the channel region electrically. As a typical configuration, the first insulator film is deposited at the entire surface over the substrate in such a manner that it covers the semiconductor layer.

As a still another typical configuration, light-shutting means such as a light-shutting film that covers at least a part of the semiconductor layer (for example, the channel region of the semiconductor layer and/or the first and the second junction regions of the semiconductor layer) is provided over the transistor. With such a configuration, it is possible to reduce the occurrence of an optical leakage current in the transistor.

In particular, according to an aspect of the invention, an elongated groove, which extends along at least one of the first junction region and the second junction region over the substrate in plan view, is formed in the first insulator film deposited between the gate electrode and the semiconductor layer (or in other words, the first insulator film that is deposited immediately under the gate electrode) in a laminated structure deposited over the substrate. That is, in the first insulator film, the groove(s) is formed in an elongated shape to extend in one direction with a certain constant distance from at least one of the first junction region and the second junction region of the semiconductor layer, which is formed to extend in the first direction, where the groove(s) extends either at both sides or one side of the first junction region and/or the second junction region in addition, the gate electrode layer has an inner groove portion that is provided in an extending manner from a gate electrode, which overlaps the channel region, to at least a part inside the above-described groove. That is, the gate electrode layer is provided in an extending manner from the gate electrode, which overlaps the channel region, to overlap at least a part of the above-described groove in plan view. The inner groove portion is provided in an extending manner from the gate electrode, which is formed flat where it overlaps the channel region. The inner groove portion may be formed on a wall portion and a bottom portion in the groove. Accordingly, when viewed in three dimensions, the inner groove portion is formed as a wall-shaped light-shielding body that is deposited along at least one of the first junction region and the second junction region of the semiconductor layer. Therefore, thanks to the presence of the inner groove portion. It is possible to shut off an incident light beam that enters at an oblique angle toward at least one of the first junction region and the second junction region of the semiconductor layer (that is, light having an optical ingredient/component along a substrate surface). That is, the inner groove portion, which is formed as a wall-shaped light-shielding body that is deposited in the vicinity of the semiconductor layer, enhances a light-shielding property to block an incident light beam that enters at an oblique angle toward the semiconductor layer. Consequently, it is possible to reduce a flicker noise and/or nonuniformity among pixels that might occur when displaying images.

As explained above, according to the electro-optical device circuit board in this aspect of the invention, it is possible to provide an electro-optical device that is capable of reducing the occurrence of an optical leakage current in a transistor that is electrically connected to a pixel electrode, and thereby reducing a flicker noise and/or nonuniformity among pixels to provide a high-quality image display.

In the electro-optical device circuit board of the above aspect of the invention, it is preferable that the grooves are provided at both sides of at least one of the first junction region and the second junction region over the substrate in plan view, and the inner groove portions are formed on both of the grooves provided at both sides thereof.

In such a configuration, the inner groove portion of the gate electrode layer is formed as a wall-shaped light-shielding body that is deposited at both sides of at least one of the first junction region and the second junction region of the semiconductor layer. Therefore, it is possible to shut off an incident light beam that enters at an oblique angle from either side toward at least one of the first junction region and the second junction region. Thus, it is possible to reduce the generation of an optical leakage current in a transistor with a greater certainty.

In the electro-optical device circuit board of the above aspect of the invention, it is preferable that the groove is provided along the second junction region over the substrate in plan view.

In such a configuration, the inner groove portion of the gate electrode layer is formed as, for example, a wall-shaped light-shielding body along the second junction region. In this connection, according to the technical and theoretical study conducted by the inventor of the subject application, it is found that, at the time of operation of the transistor, there is a relatively greater possibility of the occurrence of an optical leakage current in the second junction region than in the first junction reunion. In addition, an experiment has proved the above findings of the inventor of the subject application. With the above configuration, the inner groove portion of the gate electrode shuts off, with a greater certainty, an incident light beam that enters toward the second junction region of the semiconductor layer, which makes it possible to reduce the amount of light that enters toward the second junction region of the semiconductor layer. Consequently, it is possible to reduce the generation of an optical leakage current in a transistor more effectively.

In the electro-optical device circuit board of the above aspect of the invention, it is preferable that the inner groove portion is formed on an inner wall portion at the semiconductor layer side and a part of a bottom portion in the groove.

In such a configuration, the inner groove portion is formed on the inner wall portion at the semiconductor layer side and a part of the bottom portion in the groove, but not on the outer wall portion that is opposed to the inner wall portion at the semiconductor layer side. Thus, it is possible to ensure that an incident light beam that enters at an oblique angle toward the semiconductor layer is shut off.

In the electro-optical device circuit board of the above aspect of the invention, the gate electrode layer may be provided in an extending manner to overlap (overlie) at least the groove in plan view.

In such a configuration, the inner groove portion of the gate electrode layer is formed to consist of a wall structure portion formed along the inner wall portion at the semiconductor layer side in the groove, a portion formed on the bottom portion in the groove, and another wall structure portion formed along the outer wall portion that is opposed to the inner wall portion in the groove. Thus, it is possible to ensure that an incident light beam that enters at an oblique angle toward the semi-conductor layer is shut off.

In the electro-optical device circuit board of the above aspect of the invention, it is preferable that each of the first junction region and the second junction region is an LDD region.

In such a configuration, the transistor has an LDD structure. Accordingly, it is possible to reduce the amount of an OFF-state current that flows in the data-line-side source/drain region and the pixel-electrode-side source/drain region during the non-operating time or the transistor. In addition, it is also possible to reduce electric field relaxation at the drain terminal at the time of saturation of the transistor, which makes it further possible to suppress the decrease of an ON-state current, which is attributable to an increase in a threshold value caused by a hot carrier phenomenon (a reliability problem pertaining to degradation of transistor characteristics).

In the above aspect of the invention, it is preferable that the electro-optical device circuit board further includes a storage capacitor that is deposited over the transistor with a second insulator film being interposed therebetween, where the storage capacitor overlaps, at least partially, the semiconductor layer, and includes a light shielding electro-conductive film.

In such a configuration, the storage capacitor is electrically connected to the pixel-electric-potential-side source/drain region and the pixel electrode, and functions as a hold capacitor (i.e. retention volume) for temporally holding the electric potential of the pixel electrode. With such a configuration, it is possible to improve the electric potential retention property for holding the pixel electrode at an electric potential that is in accordance with an image signal. The storage capacitor is formed in such a manner that it overlaps, at least partially, the semiconductor layer. Typically, the storage capacitor is formed to cover the channel region, the first junction region, and the second junction region of the semiconductor layer. The storage capacitor includes a light-shielding electro-conductive film (more specifically, at least one of a pair of capacitor electrodes that constitute the storage capacitor is made of a light-shielding electro-conductive film such as a metal film). The storage capacitor functions as a built-in light-shielding film, which shuts off an incident light beam entering from the upper-layer side toward the transistor. Thus, it is possible to reduce the generation of an optical leakage current in the transistor with a greater certainty.

In the electro-optical device circuit board of the above aspect of the invention, which further includes the storage capacitor described above, it is preferable that the storage capacitor has a first capacitor portion that extends along the first direction and covers the first junction region and a second capacitor portion that covers the second junction region and has a width in other direction that intersects the first direction, where the width of the second capacitor portion is greater than the width of the first capacitor portion, and the groove is provided inside a region where the second capacitor portion is formed over the substrate in plan view.

In such a configuration of the storage capacitor, the second capacitor portion, which covers the second junction region, has a width in other direction that intersects the first direction, where the width of the second capacitor portion is greater than the width of the first capacitor portion, which covers the first junction region. More specifically, for example, the second capacitor portion is configured to have a width in the X direction that is greater than the width of the first capacitor portion with respect to the semiconductor layer that extends in the Y direction. In other words, the second capacitor portion has an extending portion that extends in other direction to be longer than the first capacitor portions. Therefore, it is possible to shut off an incident light beam that enters toward the second junction region with a greater certainty than an incident light beam that enters toward the first junction region. That is, it is possible to enhance (i.e. fortify or strengthen) a light-shielding property to block an incident light beam that enters toward, and would reach otherwise, the second junction region in comparison with a light-shielding property to block an incident light beam that enters toward, and would reach otherwise, the first junction region. In addition, because the groove is provided in a region where the second capacitor portion, which has a greater width than the first capacitor portion, is formed, the inner groove portion of the gate electrode layer formed in the groove makes it possible to shut off, with a greater certainty, an incident light beam that enters toward the second junction region, which is relatively more susceptible to an optical leakage current in comparison with the first junction region, than an incident light beam that enters toward the first junction region.

In the above aspect of the invention, it is preferable that the electro-optical device circuit board further includes a third insulator film which is deposited at the lower-layer side under the semiconductor layer, wherein the groove is formed to penetrate through the first insulator film to be formed also inside the third insulator film.

In such a configuration, the depth of the groove is greater than the interlayer distance from the upper surface of the first insulator film to the upper surface of the semiconductor layer. The inner groove portion of the gate electrode layer is formed on the wall portion and the bottom portion of the groove that is formed to go down from the upper surface of the first insulator film to penetrate through the first insulator film to be formed inside the third insulator film that is deposited at the lower-layer side under the semiconductor layer. Thus, it is possible to further enhance a light-shielding property to block an incident light beam that enters at an oblique angle toward the semiconductor layer.

In the electro-optical device circuit board of the above aspect of the invention, which further includes the third insulator film described above, it is preferable that the electro-optical device circuit board further includes a lower light-shielding film that is deposited at the lower-layer side under the third insulator film to overlap, at least partially, the semiconductor layer, where the lower light-shielding film includes a light-shielding material.

With such a configuration, thanks to the presence of the lower light-shielding film, it is possible to shut off a return light that enters from the substrate side into the device, including but not limited to, light due to backside reflection at the substrate, light that is emitted from other electro-optical device by means of a multiple-plate type projector, etc., to penetrate through a composite optical system, and so on, thereby effectively protecting the transistor. Thus, it is possible to reduce the generation of an optical leakage current in the transistor with a greater certainty.

In the electro-optical device circuit board of the above aspect of the invention, which further includes the lower light-shielding film described above, it is preferable that the lower light-shielding film is formed to overlap at least the channel region and the groove, the groove is formed in such a manner that the surface of the lower light-shielding film is exposed through the first insulator film, and the inner groove portion is electrically connected to, the lower light-shielding film.

In such a configuration, the inner groove portion of the gate electrode layer contacts the surface of the lower light-shielding film that is exposed through the first insulator film via the groove that is formed to penetrate through the first insulator film and the third insulator film, and therefore, the inner groove portion of the gate electrode layer is electrically connected to the lower light-shielding film that overlaps the channel region. Therefore, it is possible to have a portion of the lower light-shielding film that overlaps the channel region function as the gate electrode of the transistor. That is, the transistor has a double gate structure or a dual gate structure. Accordingly, it is possible to form channels at both or the upper-surface side and the lower-surface side of the channel region of the semiconductor layer. Consequently, in comparison with a case where a channel is formed at the upper-surface side of the channel region of the semiconductor layer only, it is possible to increase a current that flows in the channel region at the time of operation of the transistor, that is, an ON-state current.

In the electro-optical device circuit board of the above aspect of the invention, which further includes the lower light-shielding film described above, it is preferable that the lower light-shielding film has a first light-shielding portion that extends along the first direction and overlaps the first junction region and a second light-shielding portion that overlaps the second junction region and has a width in other direction that intersects the first direction, where the width of the second light-shielding portion is greater than the width of the first light-shielding portion, and the groove is provided inside a region where the second light-shielding portion is formed over the substrate in plan view.

In such a configuration of the lower light-shielding film, the second light-shielding portion, which covers the second junction region, has a width in other direction that intersects the first direction where the width of the second light-shielding portion is greater than the width of the first light-shielding portion, which covers the first junction region. More specifically, for example, the second light-shielding portion is configured to have a width in the X direction that is greater than the width of the first light-shielding portion with respect to the semiconductor layer that extends in the Y direction. In other words, the second light-shielding portion has an extending portion that extends in other direction to be longer than the first light-shielding portion. Therefore, it is possible to shut off an incident light beam that enters toward the second junction region with a greater certainty than an incident light beam that enters toward the first junction region. That is, it is possible to enhance (i.e. fortify or strengthen) a light-shielding property to block an incident light beam that enters toward, and would reach otherwise, the second junction region in comparison with a light-shielding property to block an incident light beam that enters toward, and would reach otherwise, the first junction region. In addition, because the groove is provided in a region where the second light-shielding portion, which has a greater width than the first light-shielding portion, is formed, the inner groove portion of the gate electrode layer formed in the groove makes it possible to shut off, with a greater certainty, an incident light beam that enters toward the second junction region, which is relatively more susceptible to an optical leakage current in comparison with the first junction region, than an incident light beam that enters toward the first junction region.

In order to address the above problem among others, an electro-optic a device according to an aspect of the invention is provided with the electro-optical device circuit board according to the above-described aspect of the invention.

According to an electro-optical device of this aspect of the invention, it is possible to provide an electro-optical device that is capable of reducing a flicker noise and/or nonuniformity among pixels to provide a high-quality image display because it is provided with the electrode-optical device circuit board according to the above-described aspect of the invention.

In order to address the above problem among others, an electronic apparatus according to an aspect of the invention is provided with the electro-optical device according to the above-described aspect of the invention.

According to an electronic apparatus of this aspect of the invention, it is possible to embody various kinds of electronic devices that are capable of providing a high-quality image display, including but not limited to, a projection-type display device, a mobile phone, an electronic personal organizer, a word processor, a viewfinder-type video recorder, a direct-monitor-view-type video recorder, a workstation, a video-phone, a POS terminal, a touch-panel device, and so forth because it is provided with the electro-optical device according to the above-described aspect of the invention. In addition, as an example of an electronic apparatus of this aspect of the invention, it is possible to embody an electrophoresis apparatus such, as an electronic paper.

These and other features, operations, and advantages of the present invention will be fully understood by referring to the following detailed description in conjunction with the accompanied drawings.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, embodiments of a circuit board for an electro-optical device according to the invention, an electro-optical device according to the invention, and an electro-optical apparatus according to the invention are described below. It should be noted that, in embodiments described below, a liquid crystal device that operates in a TFT active matrix drive scheme with a built-in driving circuit is taken as a example for the purpose of explanation.

Embodiment 1

Figure 1:
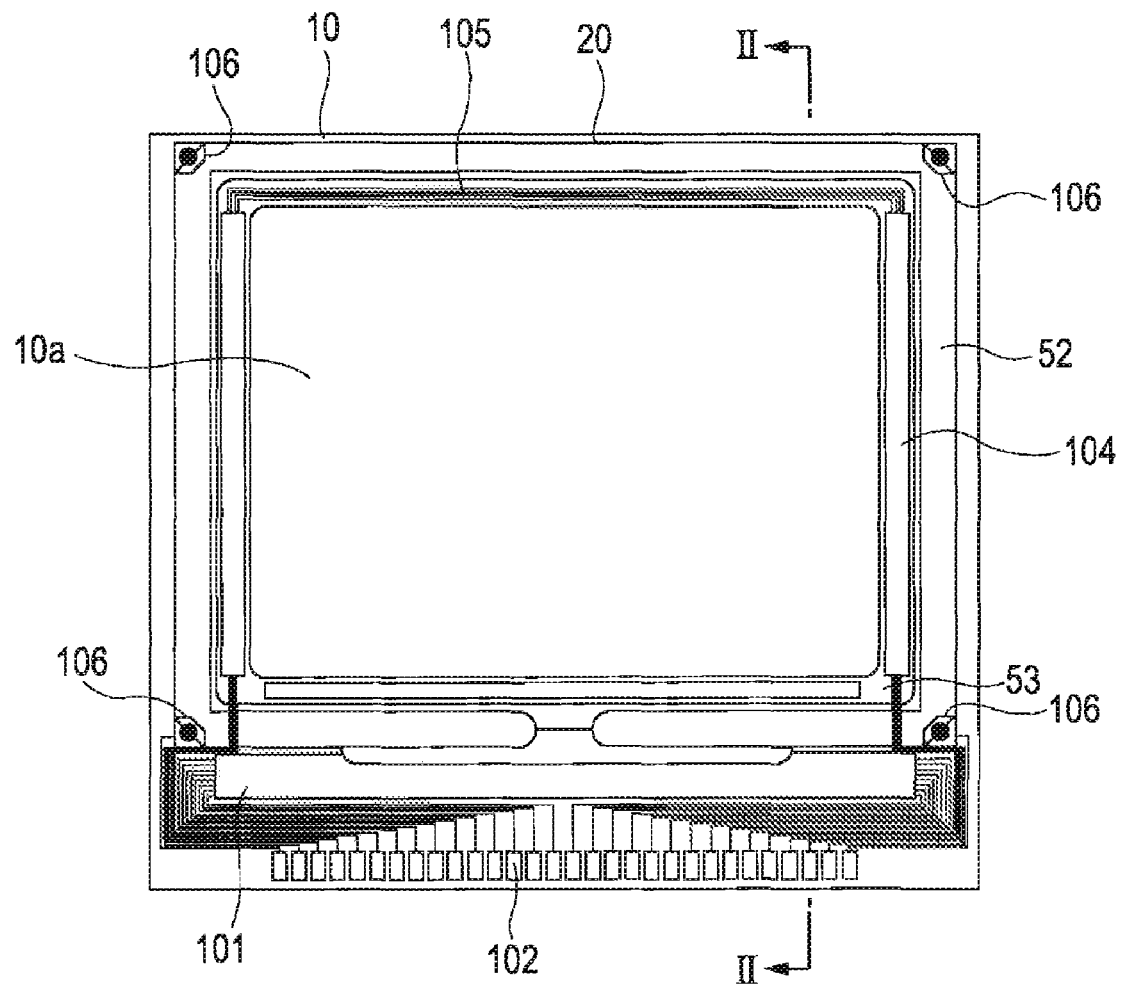
FIG. 1 is a plain view that schematically illustrates an example of the overall configuration of a liquid crystal device according to a first embodiment of the invention.
Figure 2:
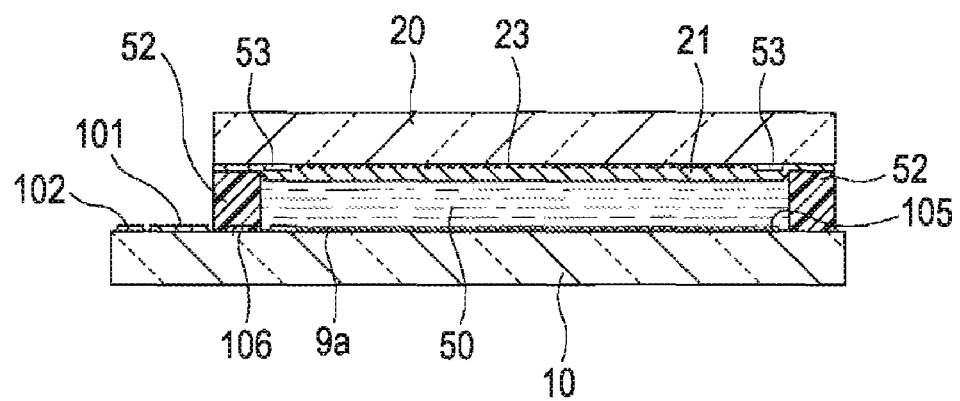
FIG. 2 illustrates an example of a cross sectional view that is cut along the line H-H' in FIG. 1.

Firstly, an example of the overall configuration of a liquid crystal device according to the present embodiment of the invention is explained while referring to FIGS. 1 and 2. FIG. 1 is a plane view of an example of a TFT array substrate and various components deposited thereon, which are viewed in combination from a certain point at the opposite substrate side. FIG. 2 illustrates an example of a cross sectional view, that is cut along the line H-H' in FIG. 1.

As shown in FIGS. 1 and 2, in a liquid crystal device according to this embodiment of the invention, a TFT array substrate and an opposite substrate 20 are arranged opposite to each other. The TFT array substrate 10 is a transparent substrate that is made of, for example, a quartz substrate, a glass substrate, a silicon substrate, and so forth. Likewise the TFT array substrate 10, the opposite substrate 20 is also a transparent substrate. A liquid crystal layer 50 is sealed between the TFT array substrate 110 and the opposite substrate 20. The TFT array substrate 10 and the opposite substrate 20 are bonded to each other with the use of a sealant material 52 that is provided at a sealing region around an image display region 10a where a plurality of pixel portions are provided, which is an example of a "display area" according to the invention.

The sealant material 52 is made from, for example, an ultraviolet (UV) curable resin, a thermosetting resin, and so on, for pasting these substrates together in a production process, the sealant material 52 is applied onto the TFT array substrate 10 and subsequently hardened through an ultraviolet irradiation treatment, a heat treatments or any other appropriate treatment. A gap material such as glass fibers, glass beads, and so on, are scattered in the sealant material 52 so as to make the distance (i.e. a gap between one substrate and the other) between the TFT array substrate 10 and the opposite substrate 20 a predetermined gap value. A liquid crystal device according to this embodiment of the invention is suitable for providing an enlarged display with a compact body, and especially suitable to be used as a light valve for a projector among many other uses.

Inside the sealing region at which the sealant material 52 is provided, and in parallel therewith, a picture frame light-shielding film 53, which has a light-shielding property and defines the picture frame region of the image display region 10a, is provided on the opposite substrate 20. Notwithstanding the above, a part or a whole of such a picture frame light-shielding film 53 may be provided at the TFT array substrate (10) side as a built-in light-shielding film.

Among the peripheral regions, a data line driving circuit 101 and external circuit connection terminals 102 are provided at one region which lies outside the sealing region at which the sealant material 52 is provided in such a manner that these data line driving circuit 101 and external circuit connection terminals 102 are provided along one of four sides of the TFT array substrate 10. A pair of scanning line driving circuits 104 is provided along two of four side thereof that are not in parallel with the above one side in such a manner that each of the scanning line driving circuits 104 is enclosed by the picture frame light-shielding film 53. In addition to the above, a plurality of electric wirings 105 is provided along the remaining one side (i.e. one that is parallel with the first-mentioned side) of the TFT array substrate 10 in such a manner that the plurality of electric wirings 105 is enclosed by the picture frame light-shielding film 53 so as to connect one of the pair of the scanning line driving circuits 104 that are provided outside the image display region 10a along the second-mentioned two sides to the other thereof.

Inter-substrate conductive material 106, which functions as conductive terminals that connect one substrate with another, are provided at four corners of the opposite substrate 20. On the other hand, another set of inter-substrate conductive terminals is provided also on the TFT array substrate 10 at positions each of which is opposite to the corresponding one of the four conductive terminals of the opposite terminal 20. With such a structure, it is possible to establish electric conduction between the TFT array substrate 10 and the opposite substrate 20.

In FIG. 2, a layered structure that includes laminations of TFTs for pixel switching, which are driver elements, and of wirings such scanning lines, data lines, and so on, is formed on the TFT array substrate 10. In the image display region 10a, pixel electrodes 9a are arranged in a matrix pattern at a layer over the wiring structure of the pixel-switching TFTs, the scanning lines, the data lines, and so forth. An alignment (i.e. orientation) film is deposited on the pixel electrodes 9a. On the other hand, a light-shielding film 23 is deposited on the surface of the opposite substrate 20 opposite to the TFT array substrate 10. The light-shielding film 23 is made of, for example, a metal film having light-shielding property. The light-shielding film 23 is formed in a grid pattern in the image display region 10a on the opposite substrate 20. Counter electrode 21, which is made of a transparent material such as ITO, is deposited on the light-shielding film 23 in a solid manner to cover the area so as to oppose to the plurality of pixel electrodes 9a. Another alignment film is deposited on the counter (i.e. opposite) electrode 21. The liquid crystal layer 50 is made of liquid crystal that consists of, for example, a mixture of one or more types of nematic liquid crystal element. Such a liquid crystal takes a predetermined orientation state between a pair of the above orientation (i.e. alignment) films.

It should be noted that other functional circuits may also be provided on the TFT array substrate 10 illustrated in FIGS. 1 and 2 in addition to driving circuits such as the above-described data line driving circuit 101, the scanning line driving circuit 104, and so on including but no limited to, a sampling circuit that samples an image signal on an image signal line to supply the sampled signal to a data line, a pre-charge circuit that supplies a pre-charge signal having a predetermined voltage level to each of the plurality of data lines prior to the supplying of an image signal, a test circuit for conducting an inspection on the quality, defects, etc., of the electro-optical device during the production process or before shipment, and so forth.

Figure 3:
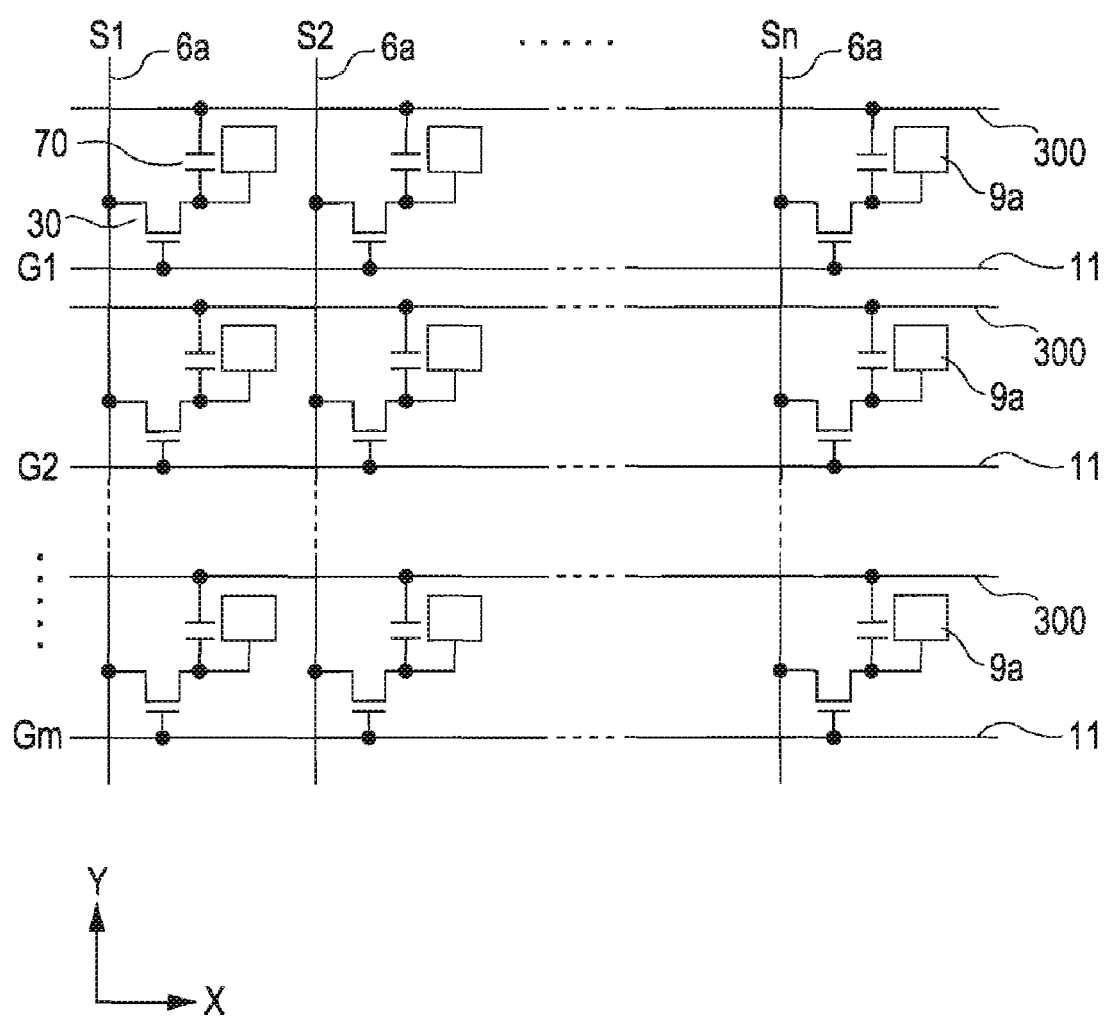
FIG. 3 is an equivalent circuit diagram that illustrates an example of a plurality of pixel portions of the liquid crystal device according to the first embodiment of the invention.

Next, the electric configuration of the pixel portion of a liquid crystal device according to the present embodiment of the invention is explained with reference to FIG. 3. FIG. 3 is an equivalent circuit diagram that illustrates an example of constituent elements and wirings in a plurality of pixels that are arranged in a matrix pattern so as to constitute the image display region of a liquid crystal device according to this embodiment of the invention.

As illustrated in FIG. 3, a TFT 30, which is an example of a "transistor" according to the invention, as well as the pixel electrode 9a is provided in each of the plurality of pixels that are arranged in a matrix pattern so as to constitute the image display region 10a. The TFT 30 is electrically connected to the pixel electrode 9a so as to perform switching control on the pixel electrode 9a at the time of operation of the liquid crystal device. Each of data lines 6a to which image signals are supplied is electrically connected to the source of the TFT 30. Image signals S1, S2, . . . , and Sn that are written on the data lines 6a may be supplied respectively in this order in a line sequential manner. Alternatively, an image signal may be supplied to each of a plurality of groups that consists of an adjacent bundle of the plurality of data lines 6a.

Each of scanning lines 11 connected to the gate of the TFT 30. The liquid crystal device according to this embodiment of the invention is configured to apply, at a predetermined timing and in a pulse pattern, scanning signals G1, G2, . . . , and Gm to the scanning lines 11 in this order in a line sequential manner. Each of the pixel electrodes 9a is electrically connected to the drain of the TFT 30. When the switch of the TFT 30, which functions as a switching element, is closed for a certain time period, the image signal S1, S2, . . . , or Sn that is supplied through the data line 6a is written at a predetermined timing. After being written into liquid crystal, which is an example of electro-optical material, via the pixel electrodes 9a, the image signals S1, S2, . . . , and Sn having a predetermined level are held for a certain time period between the pixel electrode 9a and the counter electrode formed on the opposite substrate.

Since, liquid crystal that constitutes a part of the liquid crystal layer 50 (refer to FIG. 2) changes its orientation and/or order of molecular association depending on the level of a voltage being applied, it modulates light to realize a gradation display. Under a normally-white mode, the optical transmittance with respect to an incident light beam decreases in accordance with a voltage applied in a unit of each pixel, whereas, under a normally-black mode, the optical transmittance with respect to an incident light beam increases in accordance with a voltage applied in a unit of each pixel. Thus when viewed as a whole, light having a contrast in accordance with an image signal is emitted from the liquid crystal device.

In order to prevent the leakage of the image signals being held, a storage capacitor 70 is added in parallel with a liquid crystal capacitor that is formed between the pixel electrode 9a and the counter electrode 21 (refer to FIG. 2). The storage capacitor 70 is a capacitive element that functions as a hold capacitor (idea retention volume) for temporally holding the electric potential of each of the pixel electrodes 9a in accordance with the supply of an image signal. One electrode of the storage capacitor 70 is connected to the drain of the TFT 30 in parallel connection with the pixel electrode 9a, whereas the other electrode thereof is connected to a capacitor line 300 with a fixed electric potential, so as to provide a constant electric potential (i.e. potentiostatic). According to such a storage capacitor 70, the electric potential retention property at the pixel electrode 9a is improved, which makes it further possible to enhance display characteristics as shown in the enhanced contrast and/or reduced flickers. As described later, it should he noted that the storage capacitor 70 functions also as a built-in light-shielding film that shuts off light entering toward the TFT 30.

Figure 4:
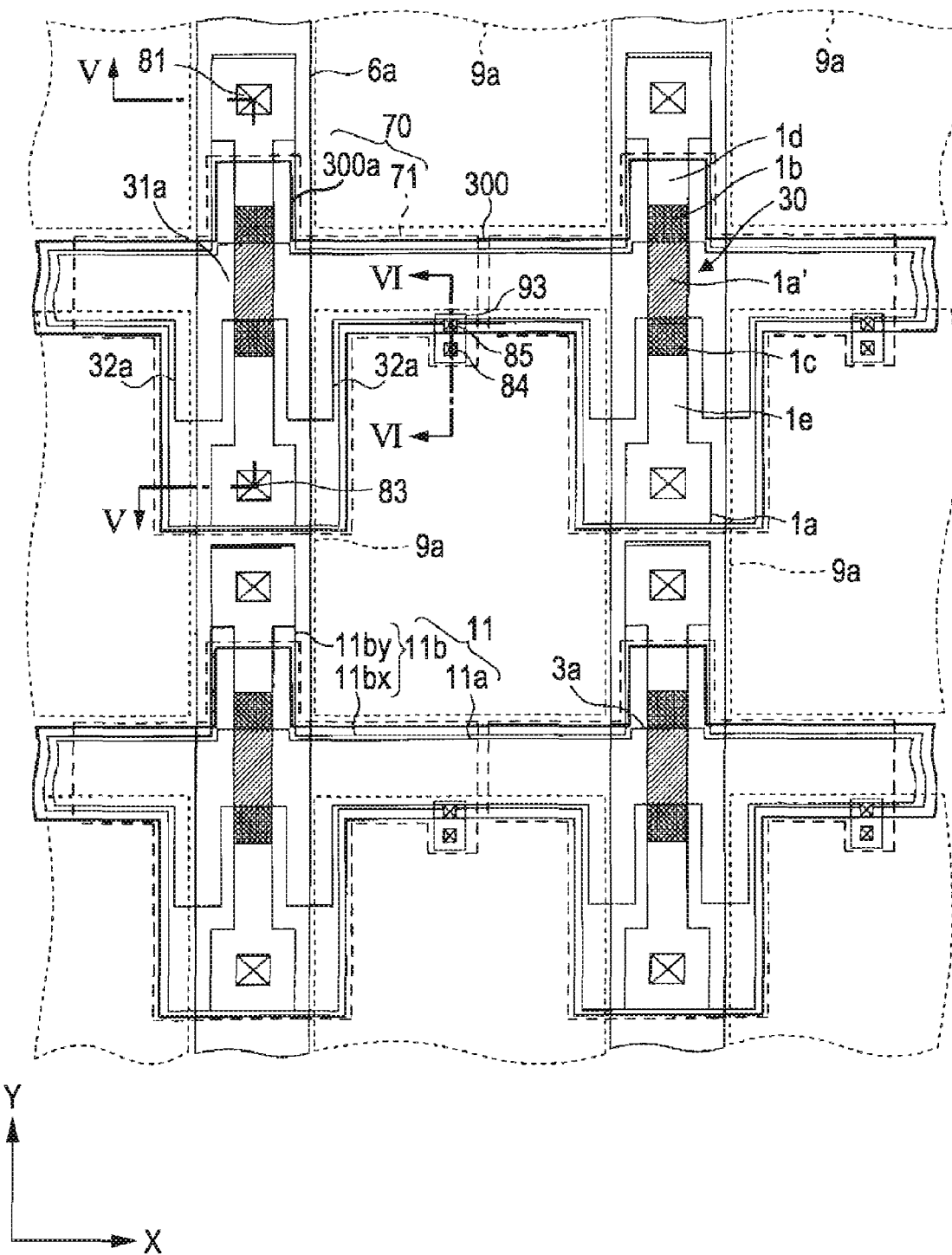
FIG. 4 is a plain view that illustrates an example of the plurality of pixel portions of the liquid crystal device according to the first embodiment of the invention.
Figure 5:
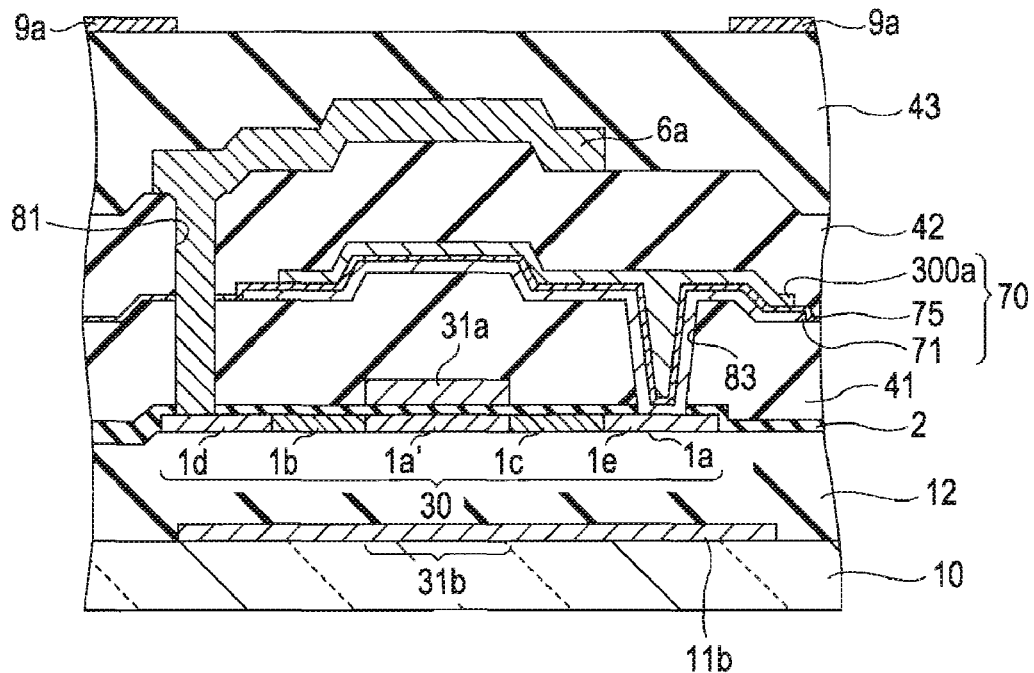
FIG. 5 illustrates an example of a cross sectional view that is cut along the line A-A' in FIG. 4.
Figure 6:
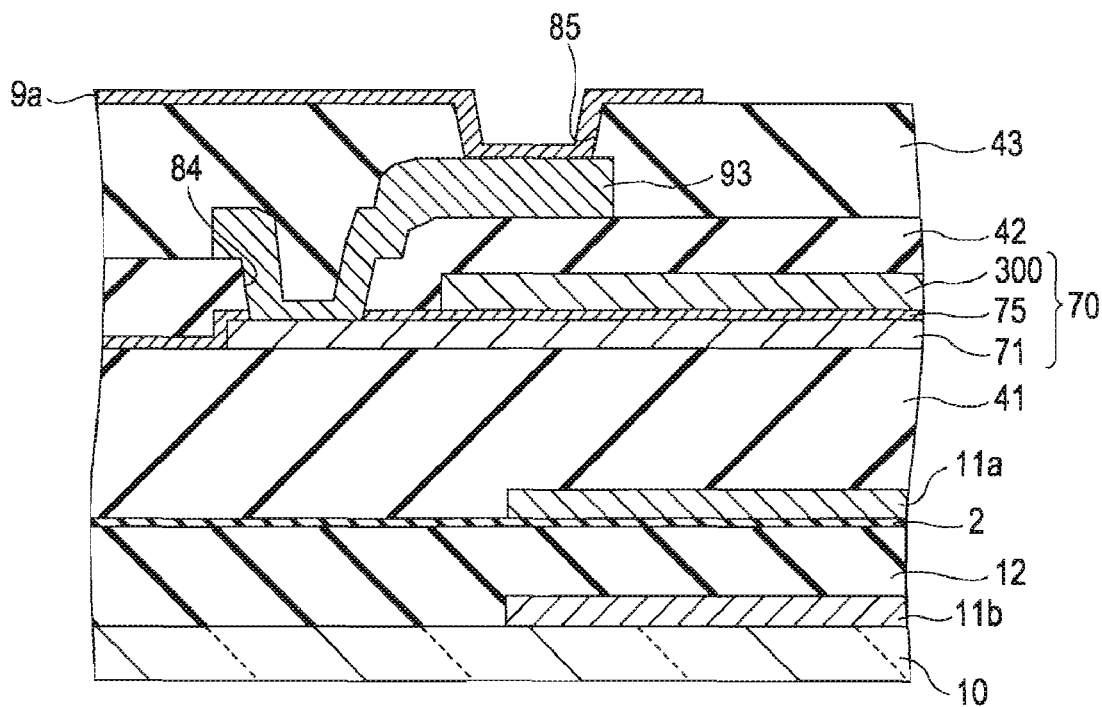
FIG. 6 illustrates an example of a cross sectional view that is cut along the line B-B' in FIG. 4.

Next, with reference to FIGS. 4-6, the specific configuration of the pixel portion that realizes the operation described above is explained below. FIG. 4 is a plane view that schematically illustrates an example of the plurality of pixel portions adjacent to one another. FIG. 5 illustrates an example of a cross sectional view that is cut along thee line A-A' in FIG. 4. FIG. 6 illustrates an example of a cross sectional view that is cut along the line B-B' in FIG. 4. In referring to FIGS. 4-6, it should be noted that different scales are used for layers/members so that each of the layers/members has a size that is recognizable in each of these drawings. The same also holds true for FIGS. 7-11 described later. For convenience of explanation, in FIGS. 4-6, layer portions above the pixel electrodes 9a are omitted from these drawings. In FIG. 5, the layer portions from the TFT array substrate 10 to the pixel electrodes 9a, inclusive thereof, constitute an example of a "circuit hoard for an electro-optical device" according to the invention.

In FIG. 4, the plurality of pixel-electrodes 9a is arranged in a matrix pattern on the TFT array substrate 10. The data lines 6a and the scanning lines 11 (i.e. scanning lines 11a and 11b) are provided respectively along the vertical and horizontal boundaries of the pixel electrodes 9a. That is, the scanning lines 11a and 11b extend in the X direction, whereas the data lines 6a extend in the Y direction so as to intersect with the scanning lines 11a or 11b. At each intersection where the data line 6a and the scanning line 11 intersect (traverse) each other, the TFT 30 for pixel switching is provided.

In plan view, the scanning line 11, the data line 6a, the storage capacitor 70, a lower light-shielding film 11a, a relay layer 33, and TFT 30 are arranged inside non-open region that surrounds the open (aperture) region of each pixel corresponding to the pixel electrode 9a (where "open" means a region in each pixel which light that actually contributes to display as transmitted through or reflected by) on the TFT array substrate 10. In other words, the scanning line 11, the storage capacitor 70, the data line 6a, the lower light-shielding film 11a, and the TFT 30 are arranged not in the open region of each pixel but in the non-open region thereof so as not to obstruct display.

In FIGS. 4 and 5, the TFT 30 is configured to include a semiconductor layer 1a and gate electrodes 31a and 31b.

The semiconductor layer 1a is made of, for example, polysilicon. The semiconductor layer 1a consists of a channel region 1a', which has a channel length along the Y direction, a data-line-side LDD region 1b, a pixel-electrode-side LDD region 1c, a data-line-side source/drain region 1d, and a pixelelectrode-side source/drain region 1e. That is, the TFT 30 has an LDD structure. It should be noted that the data-line-side LDL region 1b is an example of "a first junction region" according to the invention, whereas the pixel-electrode-side LED region 1c is an example of "a second junction region" according to the invention.

The data-line-side source/drain region 1d and the pixel-electrode-side source/drain region 1e are formed approximately in a mirror symmetry along the Y direction with respect to the channel region 1a'. The data-line-side LDD region 1b is deposited between the channel region 1a' and the data-line-side source/drain region 1d. The pixel-electrode-side LDD region 1c is deposited between the channel region 1a' and the pixel-electrode-side source/drain region 1e. The data-line-side LDD region 1b, the pixel-electrode-side POD region 1c, the data-line-side source/drain region 1d, and the pixel-electrode-side source/drain region 1e are impurity regions (impurity ranges, that are formed by implanting impurities into the semiconductor layer 1a by using, for example, an ion implantation method, and so on. The data-line-side LDD region 1b and the pixel-electrode-side LDD region 1c are deposited as lightly doped (i.e. low concentration) impurity regions having less impurities than the data-line-side source/drain region 1d and the pixel-electrode-side source/drain region 1e respectively. According to such an impurity region, it is possible to reduce the amount of an OFF-state current that flows in the source region and the drain region during the non-operating time of the TFT 30, and also to suppress the decrease of an ON-state current that flows during the operating time of the TFT 30. It should be noted that, although it is preferable that the TFT 30 has an LDD structure, it may be configured to have an offset structure in which the implantation of impurities is not performed on the data-line-side LDD region 1b and the pixel-electrode-side LDD region 1c. As another alternative example, it may be configured that impurities are heavily doped while using the gate electrode as a mask (i.e. high concentration) so as to deposit the data-line-side Source/drain region and the pixel-electrode-side source/drain region so as to have a self-aligned structure.

As illustrated in FIGS. 4 and 5, the gate electrode 31a is deposited as a part of the scanning line 11a. The scanning line 11a is formed at a layer not under the semiconductor layer 1a with an insulator film 12 interposed therebetween. The scanning line 11a is made of, for example, conductive polysilicon. In addition to the main line portion that extends in the X direction, the scanning line 11a has an extending portion that extends in the Y direction so as to overlap a region of the channel region 1a' of the TFT 30 that the main line portion does not overlap. The portion of the scanning line 11a that overlaps (overlies, but not immediately on it in the embodiment) the channel region 1a' functions as the gate electrode 31a. Because the scanning line 11a includes the gate electrode 31a, it can be referred to as a gate electrode layer. An insulator film 2, which is an example of "a first insulator film" according to the invention (refer to FIG. 5), is interposed between the gate electrode 31a and the semiconductor layer 1a to ensure insulation therebetween As illustrated in FIGS. 4 and 5, the gate electrode 31b is deposited as a part of the scanning line 11b. The scanning line 11b is formed at a layer that is not over the semiconductor layer 1a with a ground insulator film 12 interposed therebetween. The scanning line 11b is made of, for example, a conductive material having light-shielding property such as a high melting point metal material and so on. A couple of examples of such a high melting point metal material, but not limited thereto, includes tungsten (W), titanium (Ti), titanium nitride (TiN) In plan view, the scanning line 11b has a main line portion 11bx that is configured in a stripe pattern to extend along the X direction and an extending portion 11by that extends in the Y direction from the main line portion 11bx. The portion of the scanning line 11b that overlaps (underlies, but not immediately under it in the embodiment) the channel region 1a' functions as the gate electrode 31b. The scanning line 11b is configured to include a region opposite to the channel region 1a', the data-line-side LDD region 1b, the pixel-electrode-side LDD region 1c, the data-line-side source/drain region 1d, and the pixel-electrode-side source/drain region 1e of the TFT 30. Thus, thanks to the presence of the scanning line 11b, it IS possible to almost or completely shut off a return light, including but not limited to, light due to backside reflection at the TFT array substrate 10, light that is emitted from other liquid crystal device by means of a multiple-plate type projector, etc., to penetrate through a composite optical system, and so on, thereby effectively protecting the channel region 1a' of the TFT 30. That is, the scanning line 11b functions not only as wiring for supplying a scanning signal but also as a light-shielding film, of the TFT 30, which is provided to shut a return light off. Therefore, it is possible to reduce an optical leakage current in the TFT 30 during the operation of the liquid crystal device so as to improve a contrast ratio thereof, which makes it possible to provide a high definition image display.

The ground insulator film 12, which is an example of "a third insulator film" according to the invention, is interposed between the scanning line 11b and the semiconductor layer 1a to ensure insulation therebetween. The ground insulator film 12 has a function of insulating the TFT 30 from the scanning line 11b. In addition thereto, the ground insulator film 12 that is formed on the entire surface of the TFT array substrate 10 has a function of preventing any degradation in the characteristics of the TFT 30 for pixel switching, which is attributable to roughness of the surface of the TFT array substrate 10 caused at the time of surface polishing thereof, any stains that remain after washing, and so on.

As described above, according to this embodiment of the invention, the TFT 30 has the semiconductor layer 1a, the gate electrode 31a, which is deposited as a part of the scanning line 11a that is formed at the upper-layer side with respect to (i e. when viewed from, or over) the semiconductor layer 1a with the insulator film 2 being interposed therebetween, and the gate electrode 31b, which is deposited as a part of the scanning line 11b that is formed at the lower-layer side with respect to (i.e. when viewed from, or under) the semiconductor layer 1a with the ground insulator film 12 being interposed therebetween. That is, the TFT 30 has a double gate structure. Therefore, it is possible to form channels at both of the upper surface side and the lower surface side of the channel area 1a' of the semiconductor layer 1a. Thus, compared with a case where the gate electrode is formed at either one of the upper layer side and the lower layer side only with respect to the semiconductor layer 1a (i.e. either over or under the semiconductor layer 1a), this embodiment of the invention makes it possible to make the ON-state current of the TFT 30 larger.

In FIG. 4, according to this embodiment of the invention, the gate electrode 31a (or in other words, a part of the scanning line 11a) has an extending portion 32a that extends along both sides of the pixel-electrode-side LDD region 1c. In other words, the gate electrode 31a has a shape that overlaps the channel region 1a' and partially encloses the pixel-electrode-side LDD region 1c, thereby surrounding both sides thereof (that is, a so-called "upside-down U shape"). Grooves 810, which are not shown in the figure discussed now, are formed through the insulator film 2 and the ground insulator film 12. The gate electrode 31a has inner groove portions 33, each of which is formed by depositing a part of the extending portion 32a in the groove 810. A detailed explanation on such a groove and an inner groove portion is given later while referring to FIGS. 7 and 8.

In FIG. 5, the storage capacitor 70 is provided over the TFT 30, which is provided over the TFT array substrate 10, with an inter-bedded insulator film 91 as an example of "a second insulator film" according to the invention interposed therebetween.

The storage capacitor 70 consists of a lower capacitor electrode 71, an upper capacitor electrode 300a, and a dielectric film 75, where the lower capacitor electrode 71 and the upper capacitor electrode 300a are opposed to each other with the dielectric film 75 interposed therebetween.

The upper capacitor electrode 300a is configured as a part of the capacitor line 300. The capacitor line 300 extends from the image display region 10a, at which the pixel electrodes 9a are provided, to the periphery thereof. The upper capacitor electrode 300a, which is electrically connected to a constant electric potential source via the capacitor line 300, is a fixed-electric-potential-side capacitor electrode that is maintained at a constant electric potential The upper capacitor electrode 300a, which is made of, for example, an opaque metal film containing a metal, or an alloy such as Al (aluminum), Ag (silver), and so on, also functions as an upper light-shielding film (built-in light-shielding film) that shuts light off to protect the TFT 30. It should be noted that, as a "conductive light-shielding film" according to the invention, the upper capacitor electrode 300 may be made of an elemental metal, an alloy, a metal silicide, a polysilicide, or any lamination thereof, which contains at least one of a high melting point metal including but not limited to titanium (TI), chromium (Cr), tungsten (W), tantalum (Ta), molybdenum (Mo), and palladium (Pd).

In FIGS. 4-6, the lower capacitor electrode 71 is a pixel-electric-potential-side capacitor electrode that is electrically connected to the pixel-electrode-side source/drain region 1e of the TFT 30 and the pixel electrode 9a. More specifically, the lower capacitor electrode 71 is electrically connected to the pixel-electrode-side source/drain region 1e via a contact hole 83 (refer to FIGS. 4 and 5); and in addition thereto, it is electrically connected to the relay layer 93 via a contact hole 84 (refer to FIGS. 4-6). The relay layer 93 is in turn electrically connected to the pixel electrodes 9a via a contact hole 85 (refer to FIGS. 4-6). That is, functioning in combination with the relay layer 93, the lower capacitor electrode 71 offers a relay for electrical connection between the pixel-electrode-side source/drain region 1e and the pixel electrodes 9a. The lower capacitor electrode 71 is made of conductive polysilicon. Therefore, the capacitor storage has a so-called MIS structure. In addition to its function as the pixel-electric-potential-side capacitor electrode, the lower capacitor electrode 71 has a second function as a light absorption layer or a light-shielding film that is deposited between the upper capacitor electrode 300a, which serves as the upper light-shielding film, and the TFT 30.

The dielectric film 75 has a monolithic structure or multi-tiered structure made of a silicon oxide film including but not limited to an HTO (High Temperature Oxide) film, an LTO (Low Temperature Oxide) film, or of a silicon nitride film, and so on.

It should be noted that the lower capacitor electrode 71 may be made of a metal film in the same manner as the upper capacitor electrode 300a. That is, the storage capacitor 70 may be configured to have a so-called MIM structure, which has three layers consisting of a metal film—a dielectric film (insulator film)—a metal film. With such an MIM configuration, in comparison with a case where the lower capacitor electrode 71 is made of polysilicon and so on, it is possible to achieve a lower power consumption in the liquid crystal device as a whole at the time of driving the liquid crystal device, and to achieve a faster operation of elements in each of the pixel portions.

In FIGS. 5 and 6, the data lines 6a and the relay layer 93 are provided at the upper-layer side over the storage capacitor 70 deposited over the TFT array substrate 10 with the inter-bedded insulator film 42 being interposed between the storage capacitor 70 and the data lines 6a/relay layer 93.

The data line 6a is electrically connected to the data-line-side source/drain region 1d of the semiconductor layer 1a via a contact hole 81, which penetrates through the inter-bedded insulator film 41, the dielectric film 75, and the inter-bedded insulator film 42. The data lines 6a and the inner portion of the contact hole 81 are made of Al (aluminum)-containing material such as Al—Si—Cu, Al—Cu, etc., or aluminum only, or alternatively, a multilayer film that consists of an Al layer and a TiN layer, etc. The data lines 6a have an additional function of shutting light off to protect the TFT 30.

In FIGS. 4-6 the relay layer 93 is deposited at the same layer as the data lines 6a (refer to FIG. 5) on the inter-bedded insulator film 42. The data lines 6a and the relay layer 93 are formed by, firstly, depositing a thin film that is made of conductive material such as a metal film on the inter-bedded insulator film 42 by means of a thin film deposition technique, and then by partially removing the thin film (i.e. patterning) so as to separate the data lines 6a from the relay layer 93. Therefore, the manufacturing process of an apparatus is simplified because the data lines 6a and the relay layer 93 are produced in the same production step.

In FIGS. 5 and 6, the pixel electrode 9a is formed at the upper-layer side over the data line 6a with an inter-bedded insulator film 43 being interposed therebetween. The pixel electrode 9a is electrically connected to the pixel-electrode-side source/drain region 1e of the semiconductor layer 1a via the lower capacitor electrode 71, the contact holes 83, 84, and 85, and the relay layer 93. The contact hole 85 is formed by depositing a film of a conductive material such as ITO that forms the pixel electrodes 9a in the inner wall of a hole that is formed to penetrate through the inter-bedded insulator film 43. An alignment film which is subjected to a predetermined orientation processing such as rubbing processing and so on is provided on the upper surface of the pixel electrodes 9a.

The configuration of the pixel portion described above is common to each of the pixel portions as illustrated in FIG. 4. In the image display region 10a (refer to FIG. 1), the pixel portions are provided in a cyclic pattern.

Figure 7:
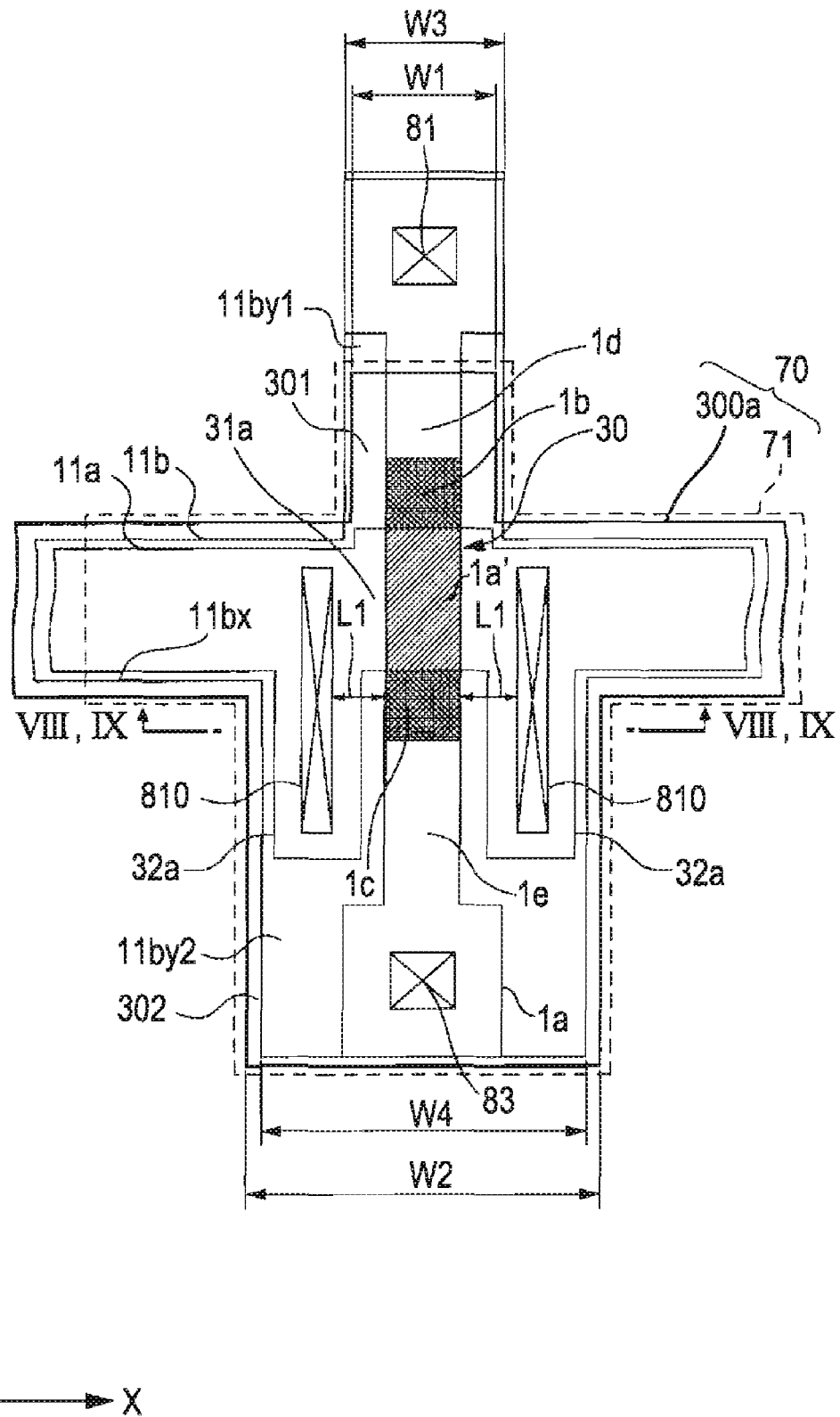
FIG. 7 is a plain view that illustrates an example of a scanning line and a storage capacitor of the liquid crystal device according to the first embodiment of the invention.
Figure 8:
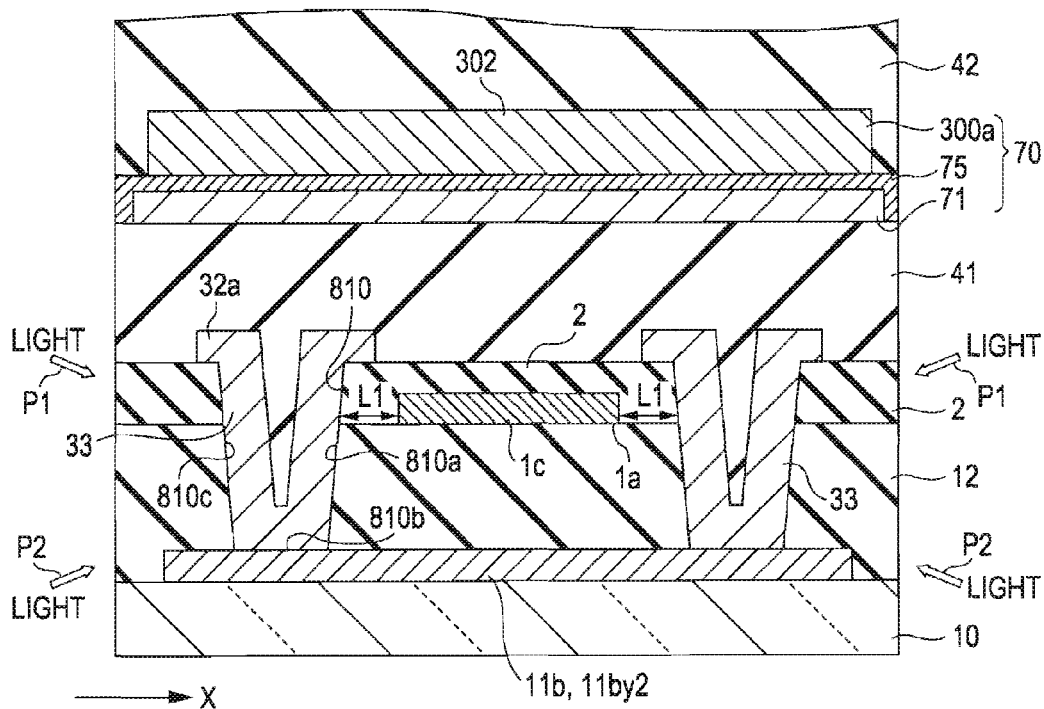
FIG. 8 illustrates an example of a cross sectional view that is cut along the line C-C' in FIG. 7.

Next, the shape of the scanning line and the storage capacitor of the liquid crystal device according to this embodiment of the invention is described in detail with reference to FIGS. 7 and 8. FIG. 7 is a plane view that illustrates the planar shape of a pair of capacitor electrodes that constitute the scanning line and the storage capacitor of the liquid crystal device according to this embodiment of the invention. FIG. 8 illustrates an example of a cross sectional view that is cut along the line C-C' in FIG. 7. It should be noted that FIG. 7 illustrates an enlarged view of the TFT 30, the scanning line 11, and the storage capacitor 70 among the constituent elements of the pixel portion illustrated in FIG. 4. Other constituent elements are omitted from the figure. In FIG. 8, constituent elements deposited at the upper-layer side over the inter-bedded insulator film 42 are not shown in the figure.

As illustrated in FIG. 7, the upper capacitor electrode 300a, which is a part of the storage capacitor 70, has a first portion 301 that covers the data-line-side LDD region 1b and a second portion 302 that covers the pixel-electrode-side LDD region 1c. Accordingly, the first portion 301 and the second portion 302 shut off an incident light beam entering from the upper-layer side to the data-line-side LDD region 1b and the pixel-electrode-side LDD region 1c, respectively. Therefore, it is possible to reduce the generation of an optical leakage, current in the data-line-side LDD region 1b and the pixel-electrode-side LDD region 1c. It should be noted that the first portion 301 is an example of "first capacitor portion" according to the invention whereas the second portion 302 is an example of "a second capacitor portion" according to the invention.

In particular, in this embodiment of the invention, the second portion 302 of the upper capacitor electrode 300a is configured such that the width of the second portion 302 in the X direction is greater than the width of the first portion 301 in the X direction. That is, the width W2 of the second portion 302 in the X direction is greater than the width W1 of the first portion 301 in the X direction. Therefore, it is possible to shut off light entering toward the pixel-electrode-side LDD region 1c with a greater certainty than light entering toward the data-line-side LDD region 1b. In other words, it is possible to make a light-shielding effect or blocking light that would reach the pixel-electrode-side LDD region 1c if it were not shut off higher or intensified in comparison with a light-shielding effect of blocking light that would reach the data-line-side LDD region 1b if it were not shut off. In this connection, the inventor of the subject application concludes that, at the time of operation of the TFT 30, there is a relatively greater possibility of the occurrence of an optical leakage current in the pixel-electrode-side LDD region 1c than in the data-line-side LDD region 1b. In other words, the inventor of the subject application concludes that, at the time of operation of the TFT 30, an optical leakage current would be more likely to be generated when light is irradiated to the pixel-electrode-side LDD region 1c than when light is irradiated to the data-line-side LDD region 1b. Since the second portion 302 has the width W2 that is greater than the width W1 of the first portion 301, it is possible to enhance a light-shielding property for the pixel-electrode-side LDD region 1c, which is relatively more susceptible to an optical leakage current, thereby effectively reducing the optical leakage current that flows in the TFT 30 Conversely, since the first portion 301, which covers the data-line-side LDD region 1b where an optical leakage current is relatively less likely to be generated in comparison with the pixel-electrode-side LDD region 1c, is configured to have a narrower width W1 than the second portion 302, it is possible to avoid unnecessary decrease in an opening ratio. Herein, the term "opening ratio" means the pixel size ratio of the open region to a sum of the open region and the non-open region. As the opening ratio increases, the display capability of the liquid crystal, device is enhanced.

FIG. 7, as described above, the scanning line 11b has the main line portion 11bx that extends in the X direction and the extending portion 11by that extends in the Y direction from the main line portion 11bx (refer to FIG. 4). The extending portion 11by has a first portion 11by1 that is formed to contain a region opposite to the data-line-side LDD region 1b and a second portion 11by2 that is formed to contain a region opposite to the pixel-electrode-side LDD region 1c. Accordingly, the first portion 11by1 and the second portion 11by2 shut off an incident light beam entering from the lower-layer side to the data-line-side LDD region 1b and the pixel-electrode-side LDD region 1c, respectively. Therefore, it is possible to reduce the generation of an optical leakage current in the data-line-side LDD region 1b and the pixel-electrode-side LDD region 1c. It should be noted that the first portion 11by1 is an example of "a first light-shielding portion" according to the invention, whereas the second portion 11by2 is an example of "a second light-shielding portion" according to the invention.

In particular, in this embodiment of the invention, the second portion 11by2 of the scanning line 11b is configured such that the width of the second portion 11by2 in the X direction is greater than the width of the first portion 11by1 in the X direction. That is, the width W4 of the second portion 11by2 in the X direction is greater than the width W3 of the first portion 11by1 in the X direction. Therefore, it is possible to shut off light entering toward the pixel-electrode-side LDD region 1c with a greater certainty than light entering toward the data-line-side LDD region 1b. Thus, it is possible to enhance a light-shielding property for the pixel-electrode-side LDD region 1c, which is relatively more susceptible to an optical leakage current, thereby effectively reducing the optical leakage current that flows in the TFT 30.

As illustrated in FIGS. 7 and 8, in this embodiment of the invention, the insulator film 2 has the elongated grooves 810, which extend along the pixel-electrode-side LDD region 1c over the TFT array substrate 10 in plan view. Each of the grooves 810 is formed in an elongated shape to extend in the Y direction with a certain constant distance L1 from the pixel-electrode-side LDD region 1c of the semiconductor layer 1a, which is formed to extend in the Y direction, where the grooves extend at both sides of the pixel-electrode-side LDD region 1c. The grooves 810 are formed by, for example, etching the surface of the insulator film 2. The grooves 810 are configured to penetrate through the insulator film 2 and the ground insulator film 12 so as to expose the surface of the scanning line 11b (or to be more exact, the scanning line 11by2). In addition, the gate electrode 31a has the inner groove portions 33 that are provided in an extending manner in the grooves 810. More specifically, the gate electrode 31a (or in other words, a part of the scanning line 11a) has the extending portion 32a that extends along both sides of the pixel-electrode-side LDD region 1c, where a part of the extending portion 32a is formed as the inner groove portion 33 deposited in the groove 810. The inner groove portion 33 is formed on an inner wall portion 810a at the semiconductor-layer-side, an outer wall portion 810c that is opposed to the inner wall portion 810a, and the bottom portion 810b in the groove 810. Accordingly, when viewed in three dimensions, the inner groove portion 33 is formed as a wall-shaped light-shielding body that is deposited along the pixel-electrode-side LDD region 1c of the semiconductor layer 1a. Therefore, thanks to the presence of the inner groove portion 33, it is possible to shut off an incident light beam that enters at an oblique angle toward the pixel-electrode-side LDD region 1c (that is, light having an optical ingredient/component that goes in the X direction or in the X direction) (for example, an incident light beam that enters in the direction shown by an arrow P1 or P2 in FIG. 8). That is, the inner groove portion 33, which is formed as a wall-shaped light-shielding body that is deposited in the vicinity of the pixel-electrode-side LDD region 1c, enhances a light-shielding property to block an incident light beam that enters at an oblique angle toward the pixel-electrode-side LDD region 1c. Consequently, it is possible to reduce a flicker noise and/or nonuniformity among pixels that might occur when displaying images.

According to this embodiment of the invention, it should be particularly mentioned that, as illustrated in FIGS. 7 and 8, the inner groove portions 33 are deposited at both sides of the pixel-electrode-side LDD region 1c. Therefore, it is possible to shut off an incident light beam that enters at an oblique angle from either side toward the pixel-electrode-side LDD region 1c, which is relatively more suspectible to an optical leakage current in comparison with the data-line-side LDD region 1b. That is, it is possible to shut off, without fail, an incident light beam that enters from either left side or right side shown in FIG. 8 to protect the pixel-electrode-side LDD region 1c, which is relatively more susceptible to an optical leakage current Thus, it is possible to ensure that the generation of an optical leakage current is reduced effectively.

As an alternative configuration, the groove 810 may be provided only at one side of the pixel-electrode-side LDD region 1c (that is, in FIG. 7, either the left side or the right side of the pixel-electrode-side LDD region 1c), where the inner groove portion 33 is formed only at one side of the pixel-electrode-side LDD region 1c. Such a configuration is also effective in enhancing a light-shielding property to block an incident light beam that enters at an oblique angle toward the pixel-electrode-side LDD region 1c to some extent. However, from the viewpoint of achieving an enhanced light-shielding effect, it is more preferable to deposit the inner groove portions 33 at both sides of the pixel-electrode-side LDD region 1c as proposed in this embodiment of the invention.

As illustrated in FIG. 8, according to this embodiment of the invention, the groove 810 penetrates through the insulator film 2 and the ground insulator film 12 to reach (i.e. expose) the scanning line 11b such that the inner groove portion 33 and the scanning line 11b are electrically connected to each other. In other words, the groove 810 is formed to function as a contact hole through which the gate electrode 31a and the scanning line 11b are electrically connected to each other via the inner groove portion 33. Thus, the depth of the groove 810 is greater than the interlayer distance from the upper surface of the inter-bedded insulator film 41 to the upper surface of the semiconductor layer 1a. The inner groove portion 33 is deposited in a wall shape to extend from the upper surface of the insulator film 2 to the scanning line 11b, which is provided at a layer below the semiconductor layer 1a. With such a configuration, it is possible to ensure that an incident light beam that enters obliquely downward from the upper outer space toward the semiconductor layer 1a (for example, an incident light beam that enters in the direction shown by the arrow P1 in FIG. 8, that is, light having an X-direction or Y-direction optical ingredient among all possible incident light beams). In addition, it is further possible to ensure that an incident light beam that enters obliquely upward from the lower outer space toward the semiconductor layer 1a (for example, an incident light beam that enters in the direction shown by the arrow P2 in FIG. 8, that is, light having an X-direction or Y-direction optical ingredient among all possible return lights).

It would be worthwhile to note that, as illustrated in FIG. 8, the inner groove portion 33 extended from the gate electrode 31a is configured to enclose the pixel-electrode-side LDD region 1c in a laminated structure (or when viewed in cross section), functioning in combination with the storage capacitor 70 (more specifically, for example, the second portion 302) and the scanning line 11b (more specifically, the second portion 11by2). Therefore, an enclosure structure that consists of the inner groove portion 33, the storage capacitor 70, and the scanning line 11b makes it possible to shut the greater part of light that goes toward the pixel-electrode-side LDD region 1c.

Figure 9:
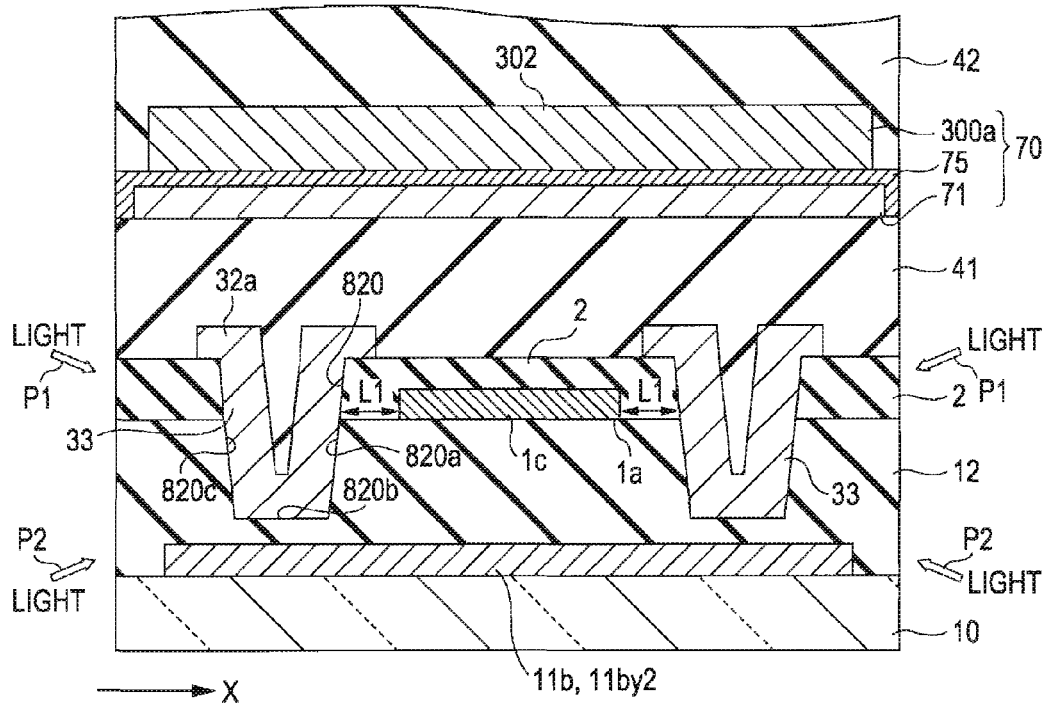
FIG. 9 is a cross sectional view that schematically illustrates a first variation of the embodiment, seen from the same viewpoint as in FIG. 8.

As illustrated in FIG. 9 as a first variation of the embodiment, it may be configured that the inner groove portion 33 and the scanning line 11b are not electrically connected to each other. FIG. 9 is a cross sectional view that schematically illustrates the first variation of the embodiment, seen from the same viewpoint as in FIG. 8. Specifically, it may be configured that the groove 820, which penetrates through the insulator film 2 and further penetrates halfway through the ground insulator film 12, that is, through a part of the upper side of the layer thereof, is provided in place of the groove 810 described above. In such a configuration, the inner groove portion 33 is deposited on an inner wall portion 820a, an outer wall portion 820c, and a bottom portion 820b in the groove 820 such that a wall-shaped structure is formed to extend from the upper surface of the insulator film 2 to a position below the semiconductor layer 1a. With such a variant configuration, thanks to the presence of the inner groove portion 33, it is possible to shut off an incident light beam that enters at an oblique angle toward the pixel-electrode-side LDD region 1c (that is, light having an optical ingredient/component that goes in the X direction or in the Y direction, (for example, an incident light beam that enters in the direction shown by the arrow P1 or P2 in FIG. 9).

The scanning line 11b may be configured such that no scanning signal is supplied thereto. That is, the scanning signal 11 may be configured to have a single function as a light-shielding film.

Figure 10:
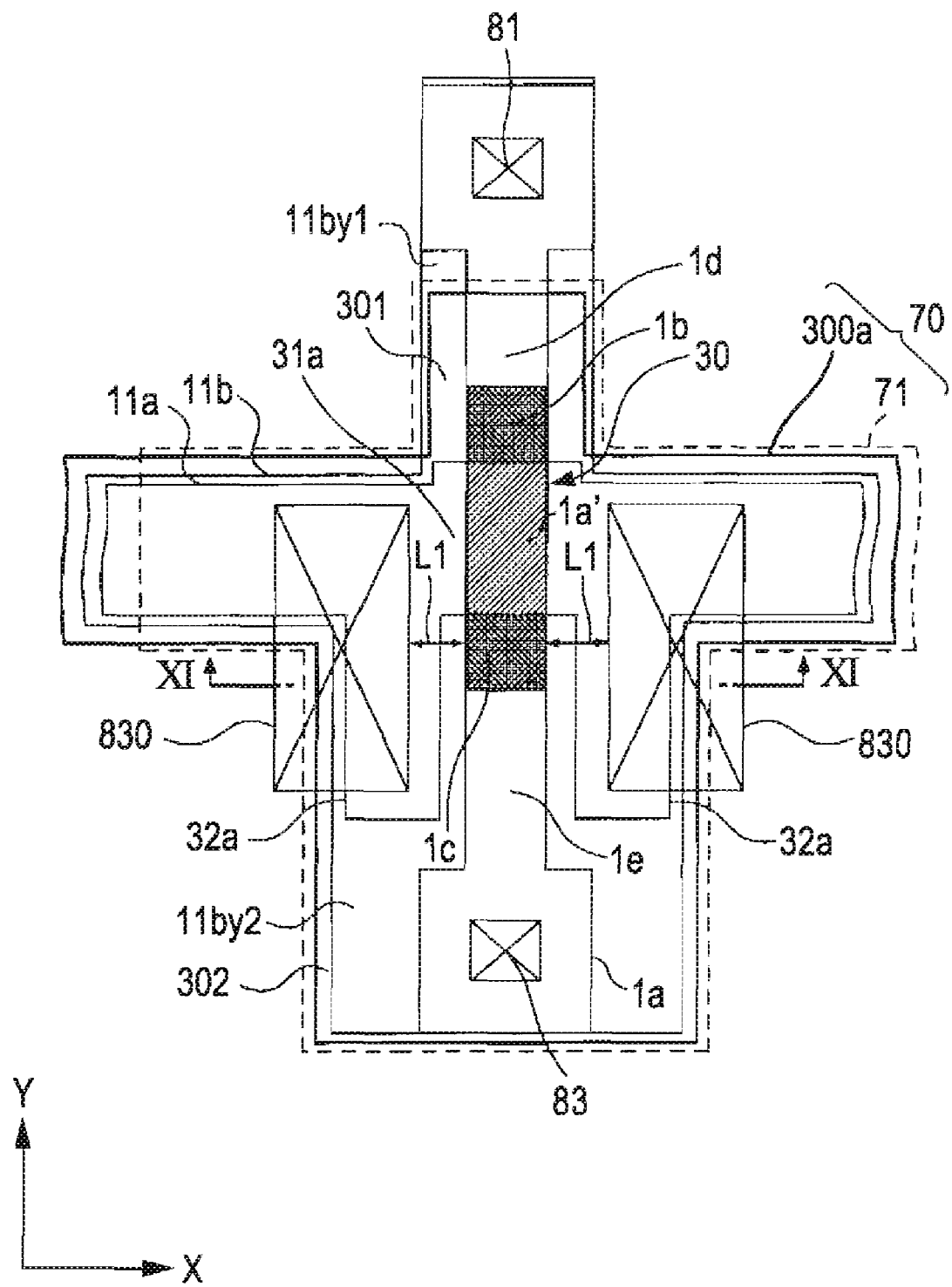
FIG. 10 is a plain view that schematically illustrates a second variation of the embodiment, seen from the same viewpoint as in FIG. 7.
Figure 11:
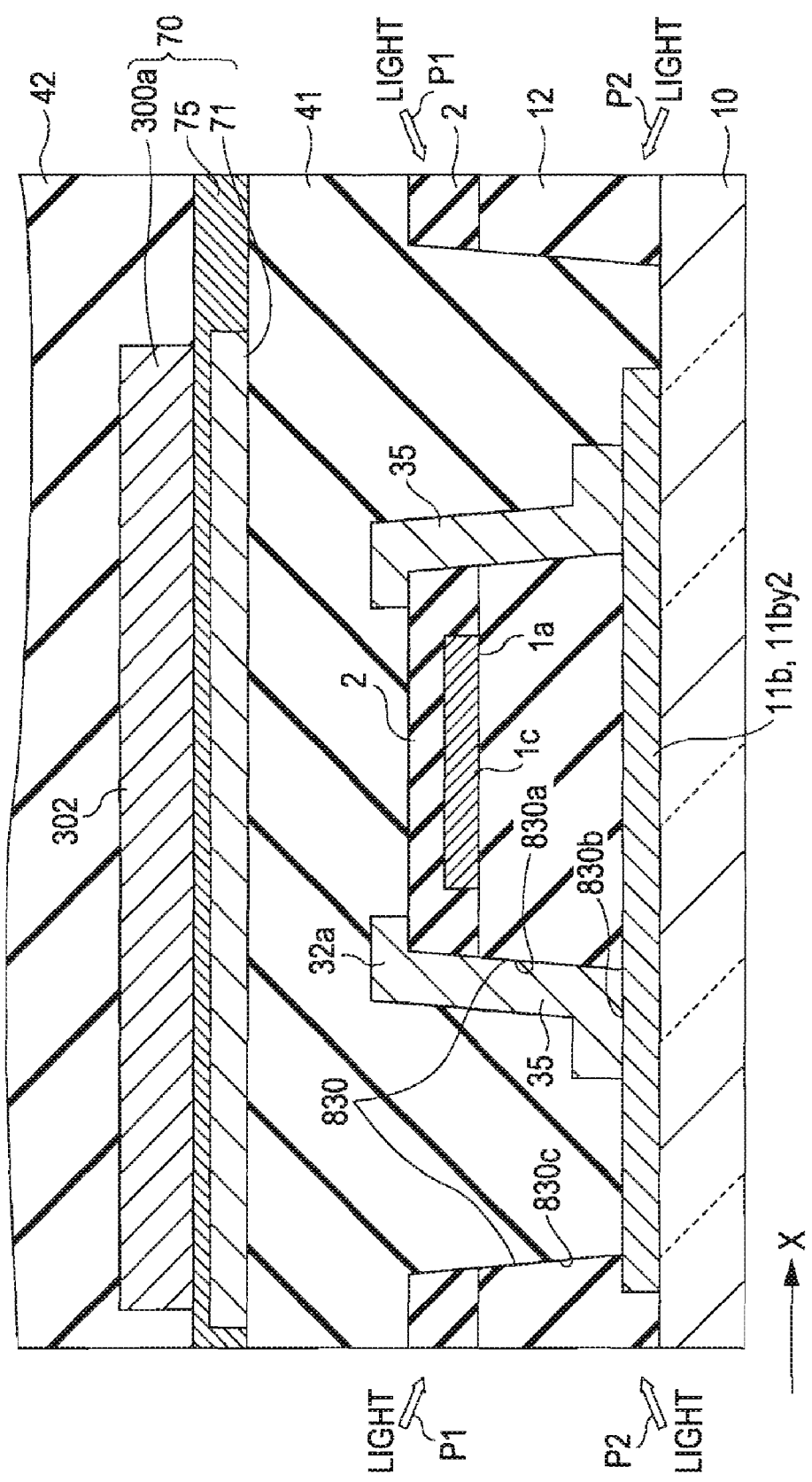
FIG. 11 illustrates an example of a cross sectional view that is cut along the line D-D' in FIG. 10.

As illustrated in FIGS. 10 and 11 as a second variation of the embodiment, it may be configured that a groove 830 having a portion which does not overlap the gate electrode 31a (or in other words, the scanning line 11a) over the TFT array substrate 10 in plan view is formed in place of the groove 810, where an inner groove portion 35 is deposited on an inner wall portion 830a at the semiconductor-layer-side and a part of a bottom portion 830b in the groove 830 in place of the inner groove portion 33. FIG. 10 is a plane view that schematically illustrates the second variation of the embodiment, seen from the same viewpoint as in FIG. 7. FIG. 11 is a cross sectional view that is cut along the line D-D' in FIG. 10. With such a variant configuration, the inner groove portion 35 formed on the inner wall portion 830a and a part of the bottom portion 830b (in particular, the wall structure formed along the inner wall portion 830a) makes it possible to shut off an incident light beam that enters at an oblique angle toward the semiconductor layer 1a. In such a variant configuration, it should be noted that the inner groove portion 35 does not have to be deposited on the outer wall portion 830c, which is opposed to the inner wall portion 830a in the groove 830.

As explained above, according to a liquid crystal device of this embodiment of the invention. It is possible to enhance a light-shielding property for protection of the pixel-electrode-side LDD region 1c of the TFT 30 or pixel switching, which makes it further possible to reduce the generation of an optical leakage current in the TFT 30. Thus, it is possible to display images of high quality, featuring reduced flicker noise and/or reduced nonuniformity among pixels.

With reference to FIGS. 12-17, in the following description, the reason why there is a relatively greater possibility of the generation of an optical leakage current in the pixel-electrode-side LDD region 1c than in the data-line-side LDD region 1b at the time of operation of the TFT 30 described above is explained in detail.

Figure 12:
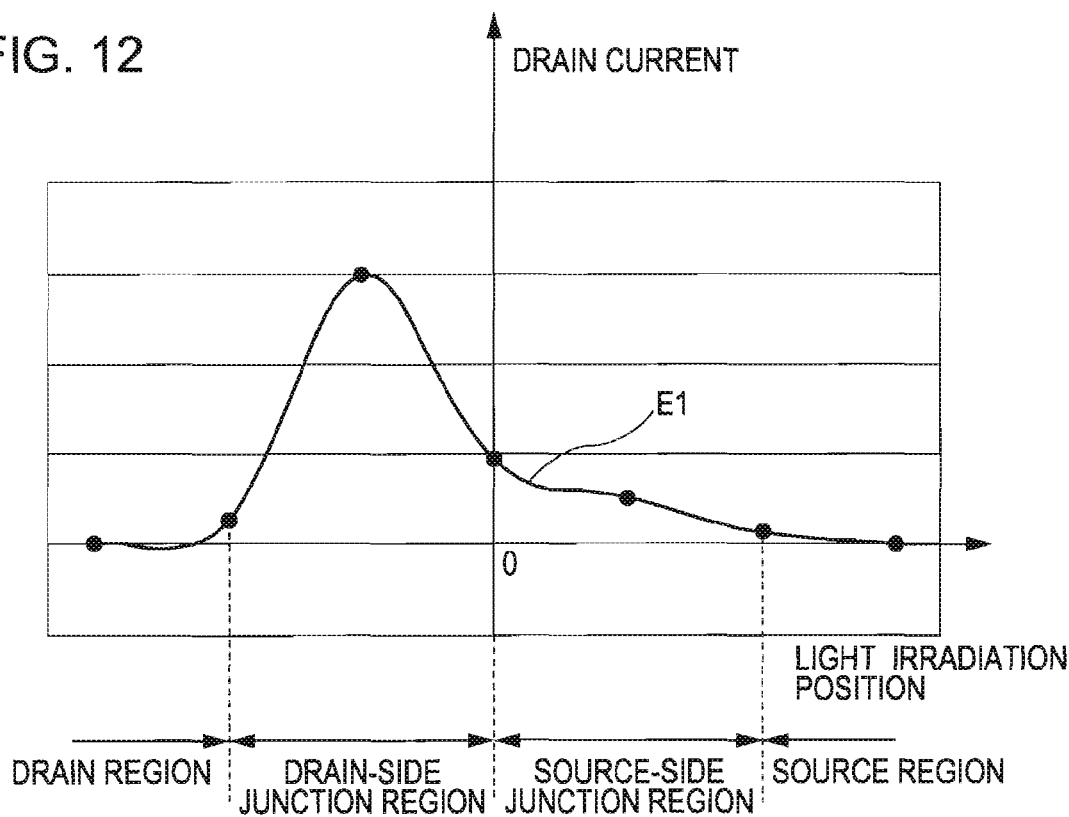
FIG. 12 is a graph that shows the relationship between a light irradiation position in a TEG and a drain current level.

Firstly, with reference to FIGS. 12, an explanation is given on the result of measurement of a drain current level when light is irradiated to a test TFT. FIG. 12 is a graph that shows the relationship between the light irradiation position in the test TFT and the drain current level.

In FIG. 12, data E1 denotes the measurement result of the level of a drain current when an optical spot (a visible light laser of approximately 2.4 µm) is irradiated to a test element TFT, that is, TEG (Test Element Group), scanning sequentially from the drain region side to the source region side. In addition to a channel region, a source region, and a drain region, the TEG has a source-side junction region that is formed at a unction portion between the channel region and the source region, and a drain-side junction region that is formed at a junction portion between the channel region and the drain region.

The horizontal axis of FIG. 12 represents a light irradiation position at which the optical spot is irradiated. In the figure, the boundary between the channel region and the drain-side junction region, the boundary between the channel region and the source-side junction region, and the channel region are defined as zero. The vertical axis of FIG. 12 represents the level of a drain current (a relative value normalized by a predetermined value). It shows a positive value (plus) when a drain current flows from the drain region to the source region, whereas it snows a negative value (minus) when the drain current flows from the source region to the drain region.

In FIG. 12, the data E1 shows a positive value at every light irradiation position. That is, it shows that the drain current flows from the drain region to the source region. In addition, the data E1 indicates greater values in the drain-side junction region than in the source-side junction region. In other words. It shows that a relatively larger drain current flows ashen an optical spot is irradiated in the drain-side junction region than in the source-side junction region. This means that relatively larger optical leakage current flows when the optical spot is irradiated in the drain-side junction region than in the source-side junction region. It should be noted that a drain current consists of a dark current (or a sub-threshold leakage current, that is, a leakage current that flows between the source region and the drain region when the TEG is in OFF state even under conditions where light is not irradiated) and an optical leakage current or an, optical beam induced current, that is, a current that is generated due to the excitation of electrons caused by irradiation of light).

Figure 13:
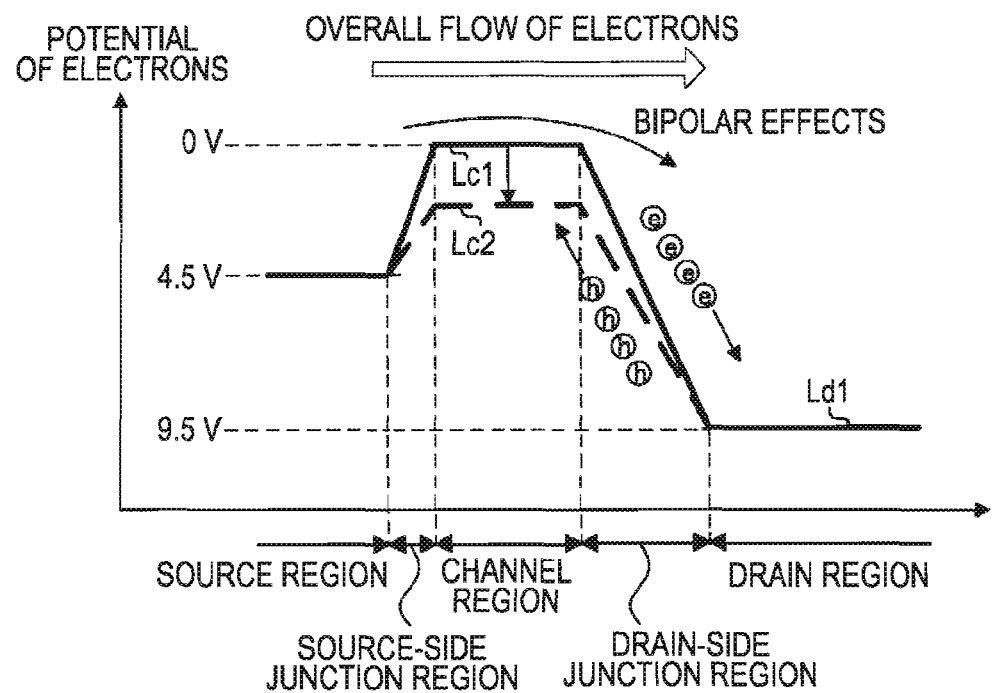
FIG. 13 is a conceptual diagram that illustrates the behavior of a carrier when light excitation occurs in a drain-side junction region.
Figure 14:
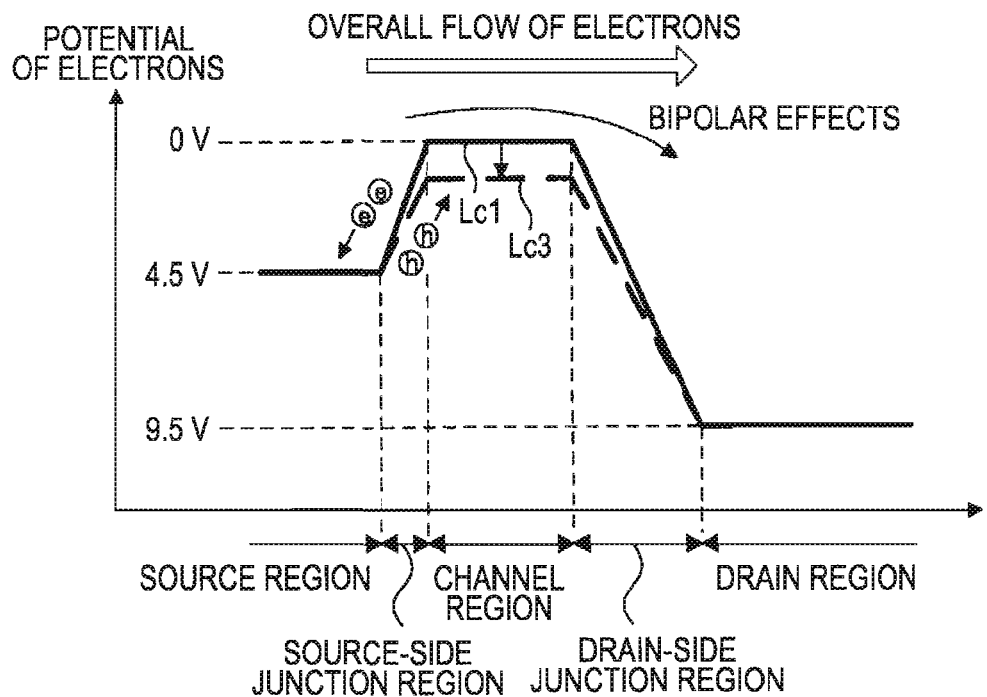
FIG. 14 is a conceptual diagram that illustrates the behavior of a carrier when light excitation occurs in a source-side junction region.

Next, with reference to FIGS. 13 and 14, an explanation is given to clarify a mechanism that a relatively larger optical leakage current flows when an optical spot is irradiated in the drain-side junction region than when it is irradiated in the source-side junction region. FIG. 13 is a conceptual diagram that illustrates the behavior of a carrier when light excitation occurs in the drain-side junction region. FIG. 14 is a conceptual diagram that illustrates the behavior of a carrier when light excitation occurs in the source-side junction region. In FIGS. 13 and 14, halftone display in the pixel electrode 9a, which the above-described TFT 30 is electrically connected to, is assumed. Accordingly, the source electric potential (i.e. the electric potential of the source region) is 4.5V. The gate electric potential (i.e. the electric potential of the channel region) is 0V. The drain electric potential (i.e. the electric potential of the drain region) is 9.5V. The horizontal axis in FIGS. 13 and 14 represents each of the regions in the semiconductor layer that forms the TEG. The vertical axis in FIGS. 13 and 14 represents the potential of electrons (Fermi level). Because the electron has a negative electric charge, the potential of an electron becomes lower as the electric potential in each region becomes higher, whereas the potential of an electron becomes higher as the electric potential in each region becomes lower.

FIG. 13 illustrates the behavior of a carrier when an optical spot is irradiated in the drain-side junction region that is formed between the channel region and the drain region to cause light excitation in the drain-side junction region.

In FIG. 13, it is presumed that an optical leakage current consists of two current components.

A first current component is a current component generated by the move of electrons that are generated by light excitation. More specifically, the first current component is a current component generated by the move of electrons that are generated by light excitation in the drain-side junction region (denoted as "e" in the figure) from the drain-side junction region to the drain region, which has a lower potential (this current component flows from the drain region to the source region).

A second current component is a current component generated by the move of holes (that is, positive holes denoted as "h" in the figure) that are generated due to light excitation. More specifically, the second current component is a current component attributable to bipolar effects, which is caused by the move of holes that are generated by light excitation in the drain-side junction region from the drain-side junction region to the channel region, which has a lower potential (that is, higher in electron potential). That is the second one is a current component due to an increase in electrons moving from the source region to the drain region (this current component flows from the drain region to the source region) because the potential of the channel region (that is, so-called base potential) is lowered from a potential Lc1 to a potential Lc2 due to the positive electric charge of holes that have moved to the channel region. Thus, when light excitation occurs in the drain-side junction region, both of the first: current component and the second current component are generated to flow in a direction that increases a drain current (or in other words, a collector current) (that is, in a direction from the drain region to the source region).

FIG. 14 illustrates the behavior of a carrier when an optical spot is irradiated in the source-side junction region that is formed between the channel region and the source region to cause light excitation in the source-side junction region.

In FIG. 14, unlike the above-described case, which is explained with reference to FIG. 13, where light excitation occurs in the drain-side junction region, it is presumed that the second current component attributable bipolar effects caused by the move of holes from the source-side junction region to the channel region, which has a lower potential (that is, higher in electron potential), a dominant. That is, it is presumed that the first current component, which is generated due to the move of electrons generated by light excitation in the source-side junction region (denoted as "e" in the figure) from the source-side junction region to the source region, which has a lower potential (this current component flows from the source region to the drain region), is less than the second current component attributable to bipolar effects (this current component flows from the drain region to the source region)

In FIG. 14, the second current component attributable to bipolar effects (that is, a current component due to an increase in electrons moving from the source region to the drain region because the base potential is lowered from the potential Lc1 to a potential Lc3 due to the positive electric charge of holes that have moved to the channel region) flows from the drain region to the source region. On the other hand, the above-described first current component flows from the source region to the drain region. That is, the first current component and the second current component flow in directions opposite to each other. Referring back to FIG. 12, the drain current level (refer to the data E1) indicates a positive value when an optical spot is irradiated in the source-side junction region. That is, in this case, a drain current flows from the drain region to the source region. Thus, it would be safe to say that the first current component merely suppresses a current component due to a dark current and/or a current component due to bipolar effects, which is a second current component, but it is not significantly large enough to cause a drain current to flow from the source region to the drain region.

In addition, because the electric potential difference between the channel region and the source region is smaller than the electric potential difference between the channel region and the drain region, the depletion region at the source-region side (that is, the source-side junction region) is narrower than the depletion region at the drain-region side (that is, the drain-side junction region). For this reason, the absolute amount of light excitation when an optical spot is irradiated in the source-side junction region is less than a case where the optical spot is irradiated in the drain-side junction region.

As described above with reference to FIGS. 13 and 14, both of the first current component and the second current component are generated to flow in a direction that increases a drain current when light excitation occurs in the drain-side junction region. On the other hand, when light excitation occurs in the source-side junction region, the first current component suppresses the second current component. Thus, a relatively larger drain current flows when an optical spot is irradiated in the drain-side junction region than in the source-side junction region (that is, a relatively larger optical leakage current flows).

Figure 15:
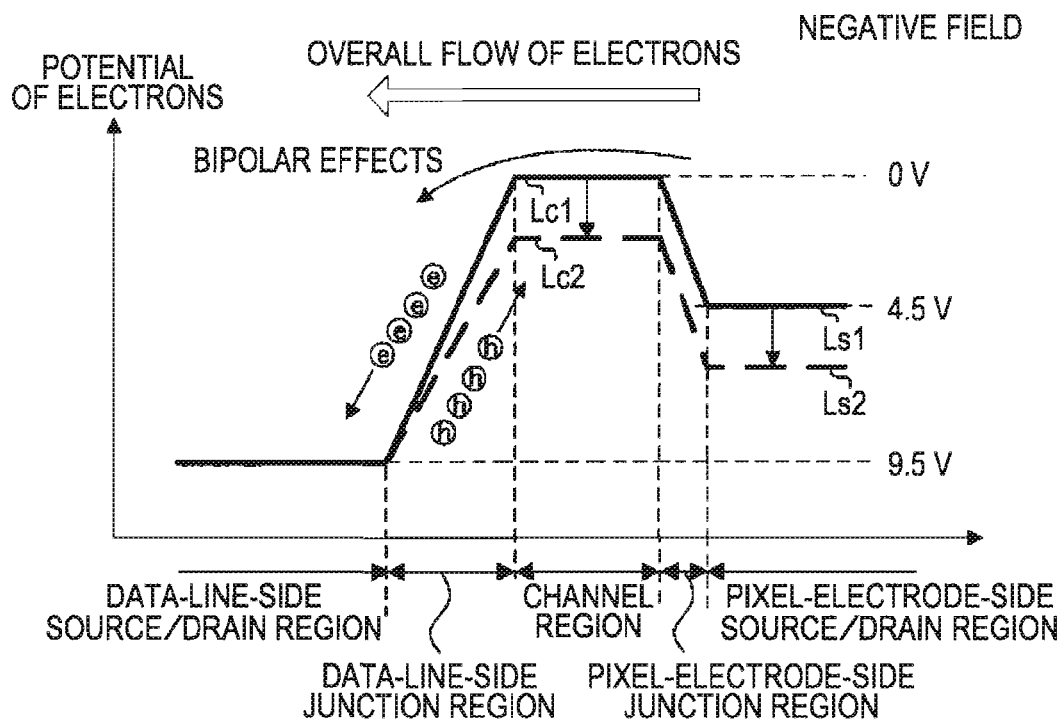
FIG. 15 is a conceptual diagram that illustrates the behavior of a carrier when eight excitation occurs in a data-line-side junction region in a case where a data-line-side source/drain region is set at a drain electric potential.
Figure 16:
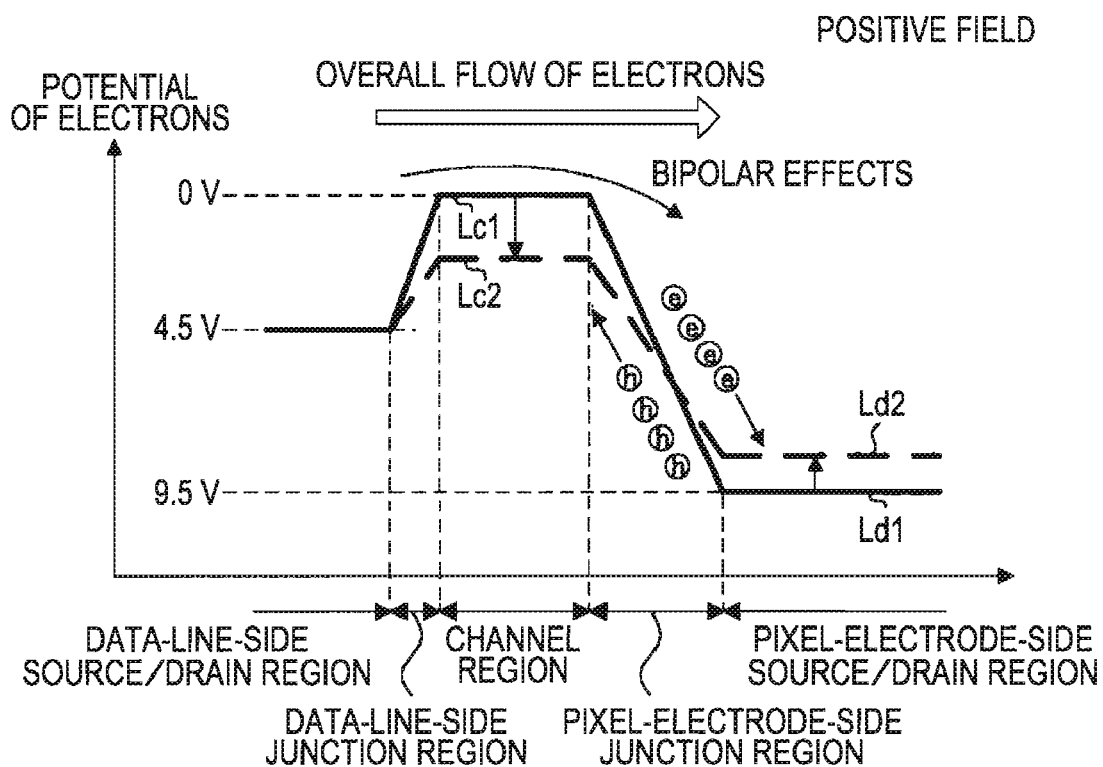
FIG. 16 is a conceptual diagram that illustrates the behavior of a carrier when light excitation occurs in a pixel-electrode-side junction region in a case where a pixel-electrode-side source/drain region is set at a drain electric potential.

Next, with reference to FIGS. 15 and 16, an explanation is given to clarify a mechanism that a relatively larger optical leakage current flows when the pixel-electrode-side source/drain region is set at a drain electric potential and an optical spot is irradiated in the pixel-electrode-side junction region in comparison with when the data-line-side source/drain region is set at a drain electric potential and an optical spot is irradiated in the data-line-side junction region. FIG. 15 is a conceptual diagram that illustrates the behavior of a carrier when light excitation occurs in the data-line-side junction region (or in other words, the drain-side junction region) in a case where the data-line-side source/drain region is set at a drain electric potential. FIG. 16 is a conceptual diagram that illustrates the behavior of a carrier when light excitation occurs in the pixel-electrode-side junction region (or in other words, the drain-side junction region) in a case where the pixel-electrode-side source/drain region is set at a drain electric potential.

In the following description, it is assumed that electric charge is held at the pixel portion containing the TFT for pixel switching, and light excitation occurs thereat. The point of difference from the above-described case where the TEG is assumed is that the pixel-electrode side of the TFT for pixel switching could be in a floating state. In some cases, a hold capacitor such as the storage capacitor 70 is connected to the pixel-electrode side of the TFT for pixel switching. If the capacitance value is sufficiently large, the pixel-electrode side of the TFT for pixel switching will be in a state similar to a fixed electrode, which is the same as when the above-described TEG is used however, if the capacitance value is not sufficiently large, the pixel-electrode side of the TFT for pixel switching will be in a floating state or a state similar thereto. In the discussion herein, it is assumed that the capacitance value is not sufficiently large.

In FIGS. 15 and 16, an alternating current driving method is adopted in a liquid crystal device so as to prevent a so-called burn-in phenomenon. Herein, under the assumption of half-tone display, it is further assumed that electric charge of 4.5V negative field and electric charge of 9.5V positive field are held in an alternating manner at the pixel electrode with the reference electric potential being 7V. Accordingly, the source and the drain of the TFT for pixel switching are not fixed but varied between the pixel-electrode-side source/drain region and the data-line-side source/drain region That is, as illustrated in FIG. 15, the pixel-electrode-side source/drain region functions as a source when the negative field electric charge is held at the pixel electrode (that is, when the electric potential of the pixel-electrode-side source/drain region is lower than the electric potential of the data-line-side source/drain region). In contrast, as illustrated in FIG. 16, the pixel-electrode-side source/drain region functions as a drain when the positive field electric charge is held at the pixel electrode (that is, when the electric potential of the pixel-electrode-side source/drain region is higher than the electric potential of the data-line-side source/drain region).

FIG. 15, the pixel-electrode-side source/drain region functions as a source (or an emitter) whereas the data-line-side source/drain region functions as a drain (or a collector) when the negative field electric charge is held at the pixel electrode. Upon the occurrence or light excitation at, the data-line-side junction region, which is the drain-side junction region, as has already been described above, the first current component, which is generated by the move of electrons that are generated by light excitation, and the second current component, which is attributable to bipolar effects are generated. When the second current component attributable to bipolar effects is generated (that is, when the base potential is lowered from the potential Lc1 to the potential Lc2 so that electrons move from the pixel-electrode-side source/drain region, which functions as the source, to the data-line-side source/drain region, which functions as the drain) the electrons flows out of the pixel-electrode-side source/drain region which is in a floating state; and therefore, the potential of the pixel-electrode-side source/drain region functioning as the emitter is lowered from the potential Ls1 to the potential Ls2 (the electric potential is raised). That is, when light excitation occurs at the data-line-side junction region, which is the drain-side junction region, the base potential decreases; and in addition thereto, the potential of the pixel-electrode-side source/drain region also decreases. In other words, when light excitation occurs at the data-line-side junction region, which is the drain-side junction region, the emitter electric potential increases as the base electrode potential increases. For this reason, the drain current (i.e. collector current) is suppressed.

On the other hand, in FIG. 16, the data-line-side source/drain region functions as the source (or the emitter) whereas the pixel-electrode-side source/drain region functions as the drain (or the collector) when the positive field electric charge is held at the pixel electrode. Upon the occurrence of light excitation at the pixel-electrode-side junction region, which is the drain-side junction region, as has already been described above, the first current component, which is generated, by the move of electrons that are generated by light excitation, and the second current component, which is attributable to bipolar effects, are generated. Unlike the pixel electrode, because the data-line-side source/drain region, which functions as the source, is connected to the data lines, the data-line-side source/drain region is not in a floating state; and therefore, the electric potential does not change. When the second current component attributable to bipolar effects is generated (that is, when the base potential is lowered from the potential Lc1 to the potential Lc2 so that electrons move from the data-line-side source/drain region, which functions as the source, to the pixel-electrode-side source/drain region, which functions as the drain), the electrons flows into the pixel-electrode-side source/drain region, which is in a floating state; and therefore, the potential of the pixel-electrode-side source/drain region functioning as the collector is raised from the potential. Ld1 to the potential Ld2 the electric potential is lowered). Unlike the decrease in the potential of the pixelelectrode-side source/drain region functioning as the source described above, however, the increase in the potential of the pixel-electrode side source/drain region functioning as the collector has almost no effects on the suppression of the drain current. Because the drain current (i e. collector current) is predominantly determined by the level of the base electric potential with respect to the emitter electric potential, even when the collector electric potential decreases, there occurs almost no effects on the suppression of the drain current. In, other words, it enters into a saturation region of the bipolar transistor.

As explained above with reference to FIGS. 15 and 16, there occurs almost no suppression of the second current component attributable to bipolar effects when the positive field electric charge is held at the pixel electrode (that is, when the pixel-electrode-side source/drain region functions as the drain), whereas, in contrast thereto, the second current component attributable to bipolar effects is suppressed because of the increase in the electric potential of the pixel-electrode-side source/drain region, which is in a floating state, when the negative field electric charge is held at the pixel electrode (that is, when the data-line-side source/drain region functions as the drain). That is, the drain current increases because of the optical leakage current when the pixel-electrode-side source/drain region functions as the drain in comparison with when the data-line-side source/drain region functions as the drain.

Figure 17:
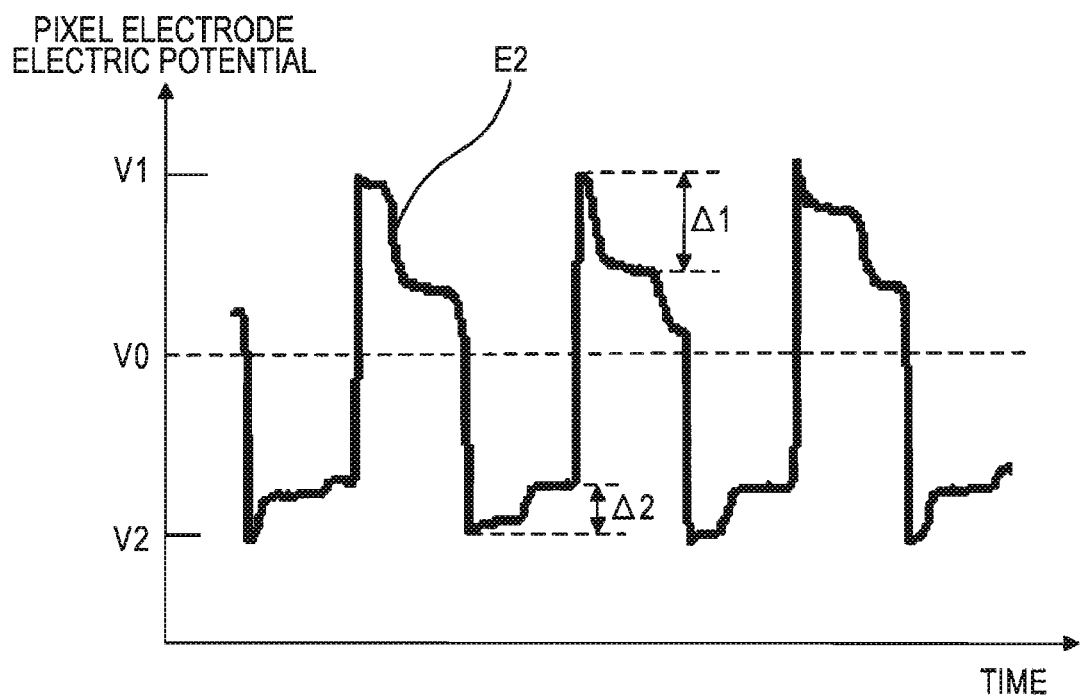
FIG. 17 is a waveform chart that illustrates the waveform of a pixel electrode electric potential when light is irradiated on the entirety of a TFT for pixel switching.

FIG. 17 illustrates the waveform of the pixel electrode electric potential when a relatively intense light is irradiated on the entirety of the TFT for pixel switching.

In FIG. 17, the data E2 shows that the fluctuation Δ1 of the pixel electrode electric potential when the positive field electric charge is held at the pixel electrode (that is, when the pixel electrode electric potential is at the electric potential (voltage) V1) is larger than the fluctuation Δ2 of the pixel electrode electric potential when the negative field electric charge is held at the pixel, electrode (that is when the pixel electrode electric potential is at the electric potential V2). That is, it shows that the positive field electric charge has a lesser tendency to be held (i.e. more susceptible to the generation of the optical leakage current) in comparison with the negative field electric charge. This observation agrees with the mechanism described above, that is, the optical leakage current would be more likely to be generated when the positive field electric charge is held at the pixel electrode (that is, the pixel-electrode-side source/drain region function as the drain) than when the negative field electric charge is held at the pixel electrode (that is, the data-line-side source/drain region function as the drain).

As described in detail above with reference to FIGS. 12-17, the drain current has a tendency to increase when light excitation occurs in the drain-side junction region of the TFT for pixel switching. In addition, the drain current has a tendency to increase when the pixel-electrode-side source/drain region functions as the drain (conversely, current component attributable to bipolar effects is suppressed when the data-line-side source/drain region functions as the drain). Therefore, as the liquid crystal device according to this embodiment of the invention proposes, it is possible to quite effectively reduce the occurrence of an optical leakage current in the TFT 30 without sacrificing a high opening ratio, which is achieved by enhancing the light-shielding property to protect the pixel-electrode-side LDD region 1c, which is the pixel-electrode-side junction region, at a higher light-protection level than the data-line-side LDD region 1b, which is the data-line-side junction region.

Electronic Apparatus

Figure 18:
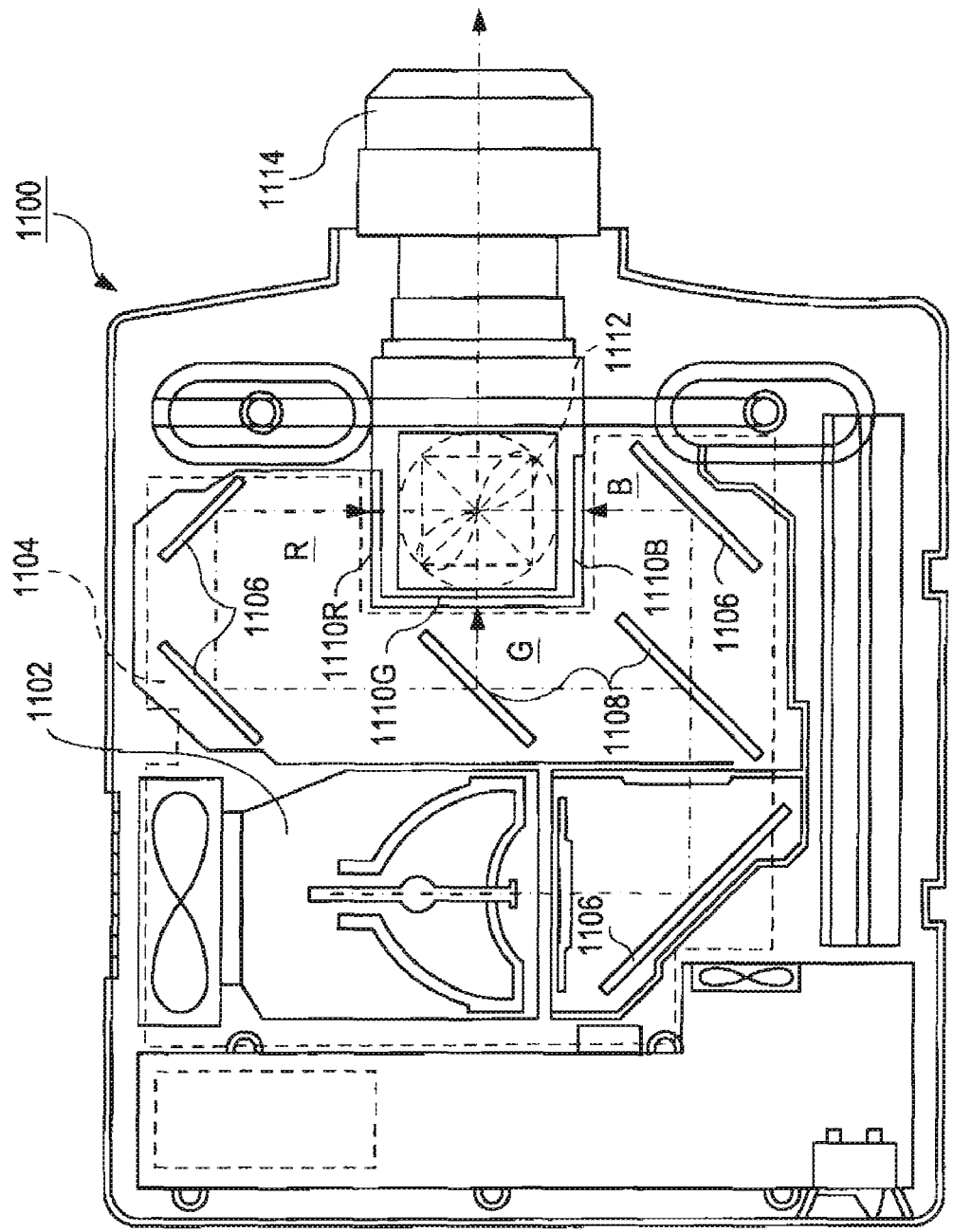
FIG. 18 is a plane view that schematically illustrates an example of the configuration of a projector, which is an example of electronic apparatuses to which an electro-optical device according to the invention is applied.

Next, an explanation is given on the application of the above-described liquid crystal device, which is an example of an electro-optical device, to various kinds of electronic apparatuses. FIG. 18 is a plane view that schematically illustrates an example of the configuration of a projector. In the following descriptions, an explanation is given on a projector that employs the above-described liquid crystal device as a light valve.

As illustrated in FIG. 18, a lamp unit 1102, which is made of a white light source such as a halogen lamp, is provided in a projector 1100. A projection light that is emitted from the lamp unit 1102 is separated into three primary color components of R, G, and B by four mirrors 1106 and two dichroic mirrors 1108 arranged in a light guide 1104. The separated primary color components of R, G, and B enter liquid crystal panels 1110R, 1110B, and 1110G, respectively, that function as light valves corresponding to the respective primary color components.

The configuration of the liquid crystal panel 1110R, 1110G, or 1110B is the same as or similar to that of the liquid crystal device described above. Each of these liquid crystal panels 1110R, 1110G, and 1110B is driven by corresponding one of the primary color signals R, G, and B, which are supplied from the image signal processing circuit. Light subjected to optical modulation by one of these liquid crystal panels enters a dichroic prism 1112 from the corresponding one of three directions. Light of R color component and light of B color component are refracted at a 90-degree angle at the dichroic prism 1112, whereas light of G color component goes straight through the dichroic prism 1112. Therefore, as a result of combination of these color components, a color image is projected on a screen, etc., through a projection lens 1114.

Focusing attention on a display image offered by each of the liquid crystal panels 1110R, 1110G, and 1110B, it is necessary to reverse the display image of the liquid crystal panel 1110G in a mirror pattern (that is, reverse the left side and the right side) with respect to the display images of the liquid crystal panels 1110R and 1110B.

Because light corresponding to each one of the primary colors R, G, and B enters into the corresponding one of the liquid crystal panel 1110R, 1110G, and 1110B thanks to the presence of the dichroic mirror 1108, it is not necessary to provide a color filter thereon.

Among a variety of electronic apparatuses to which the electro-optical device according to the invention could be embodied are, in addition to the electronic apparatus (projector) explained above with reference to FIG. 18, a mobile-type personal computer, a mobile phone, a liquid crystal display television, a viewfinder-type video recorder, a video recorder of a direct monitor view type, a car navigation device, a pager, an electronic personal organizer, an electronic calculator, a word processor, a workstation, a videophone, a POS terminal, a touch-panel device, and so forth. Needless to say, the invention is also applicable to these various electronic apparatuses without any limitation to those mentioned above.

In addition to the liquid crystal device explained in the embodiments described above, the invention is also applicable to a reflective liquid crystal display which has elements formed on a silicon substrate (LCOS, liquid crystal on silicon), a plasma display (PDP), a field emission display (FED), a surface-conduction electron-emitter display (SED)), an organic EL display, a digital micro mirror device (DMD), an electrophoresis apparatus, to name a few.

The present invention should in no case be interpreted to be limited to the specific embodiments described above. The invention may be modified, altered, changed, adapted, and/or improved within a range not departing from the gist and/or spirit of the invention apprehended by a person skilled in the art from explicit and implicit description herein as well as appended claims. A circuit board for an electro-optical device subjected to such a modification, etc., an electro-optical device having such a circuit board subjected to the modification, etc., and an electronic apparatus that is provided with such an electro-optical device, are also within the technical scope of the invention.

For example, although the scanning line 11*a* is disclosed as a gate electrode layer, the gate electrode layer can be a separate layer from the scanning line. In this case also, a portion of the gate electrode layer that overlaps the transistor channel region services as the gate electrode. However, because the gate electrode layer is a separate layer from the scanning line, it will need to be electrically be connected to the scanning line through contact roles, for example. As line above embodiment, the gate electrode layer will include portions that enter into the grooves of the gate insulation layer.

The entire disclosure of Japanese Application Nos: 2006-227413, filed Aug. 24, 2006 and 2006-306742, filed Nov. 13, 2006 are expressly incorporated by reference herein.

What is claimed is:

1. A circuit board for an electro-optical device, comprising:
   a data line;
   a gate electrode layer;
   a pixel electrode;
   a transistor including:
      a semiconductor layer including a channel region, a data-line-side source/drain region that is electrically connected to the data line, a pixel-electrode-side source/drain region that is electrically connected to the pixel electrode, a first junction region that is formed between the channel region and the data-line-side source/drain region, and a second junction region that is formed between the channel region and the pixel-electrode-side source/drain region, the channel region, the first junction region, and the second junction region being aligned in a first direction in plan view, and
      a gate electrode that is a portion of the gate electrode layer located above and overlapping the semiconductor layer; and
      a first insulator film being interposed between the gate electrode and the semiconductor layer, the first insulator film being formed with an elongated groove, the groove being elongated in the first direction and extending in the first direction along a side of at least a portion of the channel region and the second junction and not extending along the first junction region, an inner groove portion of the gate electrode layer other than the gate electrode extending at least partially inside the groove.

2. The electro-optical device circuit board according to claim 1, wherein the first insulator film is formed with an other elongated groove, the groove and the other groove being provided at both sides of at least one of the first junction region and the second junction region over the substrate in plan view, and the gate electrode layer including inner groove portions formed in both the groove and the other groove.

3. The electro-optical device circuit board according to claim 1, wherein the groove is provided along the second junction region over the substrate in plan view.

4. The electro-optical device circuit board according to claim 1, wherein the inner groove portion is formed on an inner wall portion at the semiconductor layer side of the groove and on a part of a bottom portion of the groove.

5. The electro-optical device circuit board according to claim 1, wherein the gate electrode layer is provided in an extending manner to overlap at least the groove over the substrate in plan view.

6. The electro-optical device circuit board according to claim 1, wherein each of the first junction region and the second junction region is a lightly doped drain (LDD) region.

7. The electro-optical device circuit board according to claim 1, farther comprising a storage capacitor that is formed above the transistor with a second insulator film being interposed between the transistor and the storage capacitor, the storage capacitor overlapping, at least partially, the semiconductor layer, and the storage capacitor including a light-shielding electro-conductive film.

8. The electro-optical device circuit board according to claim 7, wherein the storage capacitor has a first capacitor portion covering the first junction region and a second capacitor portion covering the second junction region, the first capacitor portion having a width in a second direction that intersects the first direction, the second capacitor portion having a width in the second direction, the width of the second capacitor portion being greater than the width of the first capacitor portion, the groove is provided inside a region overlapping the second capacitor portion in plan view.

9. The electro-optical device circuit board according to claim 1, further comprising a third insulator film located under the semiconductor layer, the groove being formed to penetrate through the first insulator film to be formed also inside the third insulator film.

10. The electro-optical device circuit board according to claim 9, further comprising a lower light-shielding film that is located under the third insulator film and that overlaps, at least partially, the semiconductor layer, the lower light-shielding film including a light-shielding material.

11. The electro-optical device circuit board according to claim 10, wherein the lower light-shielding film overlaps at least the channel region and the groove, the groove being formed in such a manner that a surface of the lower light-shielding film is exposed through the first insulator film, and the inner groove portion is electrically connected to the lower light-shielding film.

12. The electro-optical device circuit board according to claim 10, wherein the lower light-shielding film has a first light-shielding portion that overlaps the first junction region and a second light-shielding portion that overlaps the second junction region, the first light-shielding portion having a width in a second direction that intersects the first direction, the second light-shielding portion having a width in the second direction, the width of the second light-shielding portion being greater than the width of the first light-shielding portion, and the groove is provided inside a region where the second light-shielding portion is formed over the substrate in plan view.

* * * * *